(12) United States Patent
Nomura

(10) Patent No.: US 8,588,950 B2
(45) Date of Patent: Nov. 19, 2013

(54) SUBSTRATE PROCESSING APPARATUS

(75) Inventor: Makoto Nomura, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 195 days.

(21) Appl. No.: 13/036,485

(22) Filed: Feb. 28, 2011

(65) Prior Publication Data

US 2011/0218659 A1 Sep. 8, 2011

(30) Foreign Application Priority Data

Mar. 2, 2010 (JP) ................................. 2010-045764

(51) Int. Cl.
*G06F 19/00* (2011.01)
*G06F 7/00* (2006.01)
*B65G 25/00* (2006.01)
*H01L 21/677* (2006.01)

(52) U.S. Cl.
USPC ........... 700/100; 700/108; 700/114; 700/121; 700/228; 414/152; 414/172; 414/217

(58) Field of Classification Search
USPC ................. 700/100, 101, 108, 114, 121, 228; 414/152, 172, 217, 939, 940
See application file for complete search history.

(56) References Cited

U.S. PATENT DOCUMENTS

| | | | | |
|---|---|---|---|---|
| 6,069,096 A | * | 5/2000 | Nishihata et al. | 700/229 |
| 6,941,185 B2 | * | 9/2005 | Nishihata et al. | 700/121 |
| 7,367,769 B2 | | 5/2008 | Ishii et al. | |
| 2005/0090927 A1 | * | 4/2005 | Tanaka et al. | 700/121 |
| 2006/0181699 A1 | * | 8/2006 | Numakura | 356/237.2 |
| 2007/0275486 A1 | * | 11/2007 | Hiroki | 438/16 |
| 2010/0076729 A1 | * | 3/2010 | Davis et al. | 702/184 |
| 2010/0087944 A1 | * | 4/2010 | Kanaya et al. | 700/103 |
| 2011/0202162 A1 | * | 8/2011 | Sueyoshi et al. | 700/108 |
| 2012/0010825 A1 | * | 1/2012 | Hadley et al. | 702/24 |
| 2012/0046774 A1 | * | 2/2012 | Nakamura et al. | 700/100 |

FOREIGN PATENT DOCUMENTS

| | | |
|---|---|---|
| JP | 11-067869 | 3/1999 |
| JP | 11-067869 A | 3/1999 |
| JP | 2002-280279 A | 9/2002 |
| JP | 2006-179528 | 7/2006 |

* cited by examiner

Primary Examiner — Kavita Padmanabhan
Assistant Examiner — Darrin Dunn
(74) Attorney, Agent, or Firm — Volpe and Koenig, P.C.

(57) ABSTRACT

Only a wafer for QC check may be transferred and a production wafer may prevent from being transferred into an assigned process chamber whose QC check is not completed after a maintenance task, and the production wafer may be processed the assigned process chamber after the completion of the QC check. The wafer for QC check is transferred while inhibiting a transfer of the production wafer into the assigned process chamber, and the production wafer is transferred into each of the process chambers of the plurality except the assigned process chamber.

7 Claims, 14 Drawing Sheets

US 8,588,950 B2

SUBSTRATE PROCESSING APPARATUS

CROSS-REFERENCE TO RELATED PATENT APPLICATION

This U.S. non-provisional patent application claims priority under 35 U.S.C. §119 of Japanese Patent Applications No. 2010-045764 filed on Mar. 2, 2010 to the Japanese Patent Office, the entire contents of which are hereby incorporated by reference.

BACKGROUND OF THE INVENTION

1. Field of the Invention

The present invention relates to a substrate processing apparatus.

2. Description of the Related Art

A conventional substrate processing apparatus, which performs one process in a method of manufacturing a semiconductor device, includes a plurality of process chambers for processing a substrate, a plurality of process controllers respectively connected to the plurality of process chambers to individually control processing of the substrate in the plurality process chambers, an integrated controller respectively connected to the plurality of process controllers to control an operation of a transfer mechanism that transfers the substrate between the process chambers and a transfer chamber, and a manipulation unit respectively connected to the integrated controller and the plurality of process controllers to transmit a processing instruction to the plurality of process controllers and simultaneously receive operation reports from the plurality of process controllers via the integrated controller.

Moreover, an operation mode of the process chambers managed by the integrated controller is divided into two modes: a maintenance mode in which a wafer is not transferred, and a production mode (a normal state) in which a production wafer is transferred and processed. In the maintenance mode, the maintenance checks of parts constituting the process chamber after repeating a predetermined production. A thickness of a film obtained by measuring a film thickness of a substrate processed in the process chamber after a maintenance task thereof completed and the number of particles adhered to a surface of the substrate (hereinafter, referred to as 'quality control (QC) check') are checked after the operation mode of the process chamber is set to a production mode.

Therefore, in order to prevent the production wafer from being loaded into the process chamber during the QC check, the process chamber must be separated during the QC check. However, since a disassembling work and an installation work of the process chamber are required, the maintenance time is long and the productivity of an apparatus is degraded.

SUMMARY OF THE INVENTION

It is an object of the present invention to provide a substrate processing apparatus and a method of manufacturing a semiconductor device that transfers only a wafer for QC check and prevents a production wafer from being transferred into an assigned process chamber whose QC check is not completed after a maintenance task, processes the production wafer in the assigned process chamber after the completion of the QC check, and facilitates improved productivity of an apparatus.

In accordance with one embodiment of the present invention, there is provided a substrate processing apparatus including: a plurality of process chambers configured to process substrates; a transfer chamber connected to the process chambers; a transfer mechanism located inside the transfer chamber to transfer the substrates between the transfer chamber and the process chambers; a process controller connected to each of the plurality of process chambers to control a processing of the substrates in each of the plurality of process chambers; an integrated controller connected to the process controller to control an operation of the transfer mechanism; and a manipulation unit connected to the integrated controller and the process controller, the manipulation unit being configured to transmit a command thereto and to receive an operation report from the transfer mechanism via the integrated controller, wherein the manipulation unit includes a display unit displaying a setting screen for selecting one of a maintenance mode wherein a maintenance check of the plurality of process chambers is performed, a QC mode wherein a quality control substrate into is processed in the plurality of process chambers after performing the maintenance check and a production mode wherein a production substrate is processed in the plurality of process chambers, wherein, when a predetermined process chamber and of the plurality of process chambers is set to the maintenance mode on the setting screen, the integrated controller controls the transfer mechanism to inhibit a transfer of the substrates into the predetermined process chamber, wherein, when the predetermined process chamber of the plurality of process chambers is set to the QC mode on the setting screen, the integrated controller controls the transfer mechanism to transfer the quality control substrate into the predetermined process chamber while inhibiting a transfer of the product substrate into the predetermined process, and wherein, when the predetermined process chamber of the plurality of process chambers is set to the production mode on the setting screen, the integrated controller controls the transfer mechanism to transfer the product substrate into the predetermined process chamber while inhibiting a transfer of the quality control substrate into process chambers of the plurality of process chambers other than the predetermined process chamber.

According to another embodiment of the present invention, there is provided a substrate processing apparatus comprising: a plurality of process chambers for processing a substrate; a transfer chamber connected to the process chambers; a transfer mechanism located inside the transfer chamber to transfer the substrate between the transfer chamber and the process chambers; a process controller connected to each of the process chambers to control processing of the substrate in each of the process chambers; an integrated controller connected to the process controller to control an operation of the transfer mechanism; and a display unit for displaying a setting screen to select a maintenance mode for performing a maintenance check one predetermined process chamber of process chambers of the plurality, a QC mode for processing a quality control substrate in the plurality of process chambers after performing the maintenance check, and a production mode for processing a production substrate as an operation modes of the plurality of process chambers.

According to yet another embodiment of the present invention, there is provided a method of transferring a substrate performed in a substrate processing apparatus of the present invention, the method including: designating a predetermined process chamber of a plurality of process chambers to a maintenance mode when an error occurs in the predetermined process chamber during a transfer of a product substrate and transferring the product substrate into the plurality of process chambers other than the predetermined process chamber while inhibiting the transfer of the product substrate into the predetermined process chamber; designating the predetermined process chamber to a QC mode wherein a quality control substrate is processed after a maintenance check is complete and transferring a quality control substrate into the predetermined process chamber while continuously inhibiting the transfer of the product substrate into the predetermined process chamber; inspecting a quality of the quality control substrate; and designating the predetermined process chamber to a production mode and transferring the production substrate into the predetermined process chamber when the quality of the quality control substrate satisfies a predetermined level, and re-designating the predetermined process to the maintenance mode from the QC mode when the quality of the quality control substrate dissatisfies the predetermined level.

According to yet another embodiment of the present invention, there is provided a method of manufacturing a semiconductor device performed in a substrate processing apparatus of claim 1, the method including: designating a predetermined process chamber of a plurality of process chambers to a maintenance mode by an integrated controller when an error occurs in the predetermined process chamber during a processing of a product substrate and processing the product substrate in the plurality of process chambers other than the predetermined process chamber by a process controller while inhibiting the transfer of the product substrate into the predetermined process chamber; designating the predetermined process chamber to a QC mode from the maintenance mode wherein a quality control substrate is processed by the integrated controller after a maintenance check is complete and transferring a quality control substrate into the predetermined process chamber while continuously inhibiting the transfer of the product substrate into the predetermined process chamber; processing the quality control substrate in the predetermined process chamber by the process controller while processing the product substrate in the plurality of process chambers other than the predetermined process chamber by the process controller; inspecting a quality of the quality control substrate; and designating the predetermined process chamber to a production mode by the integrated controller and transferring the product substrate to the predetermined process chamber, and processing the production substrate in the plurality of process chambers when the quality of the quality control substrate satisfies a predetermined level, and re-performing the maintenance check when the quality of the quality control substrate dissatisfies the predetermined level.

According to a substrate processing apparatus and a method of manufacturing a semiconductor device of the present invention, the productivity of an apparatus is especially improved since a production substrate is prevented from being transferred into a predetermined process chamber in which a QC check is performed whereas the production substrate is processed in other process chambers except the predetermined process chamber, and since the production substrate is processed in the predetermined process chamber in which the QC check has been performed at a point of time when the QC check is completed.

DETAILED DESCRIPTION OF THE PREFERRED EMBODIMENTS

Embodiment of the Present Invention

Hereinafter, a configuration and an operation of a substrate processing apparatus in accordance with one embodiment of the present invention will be described in detail.

(1) Configuration of Substrate Processing Apparatus

Figure 1:
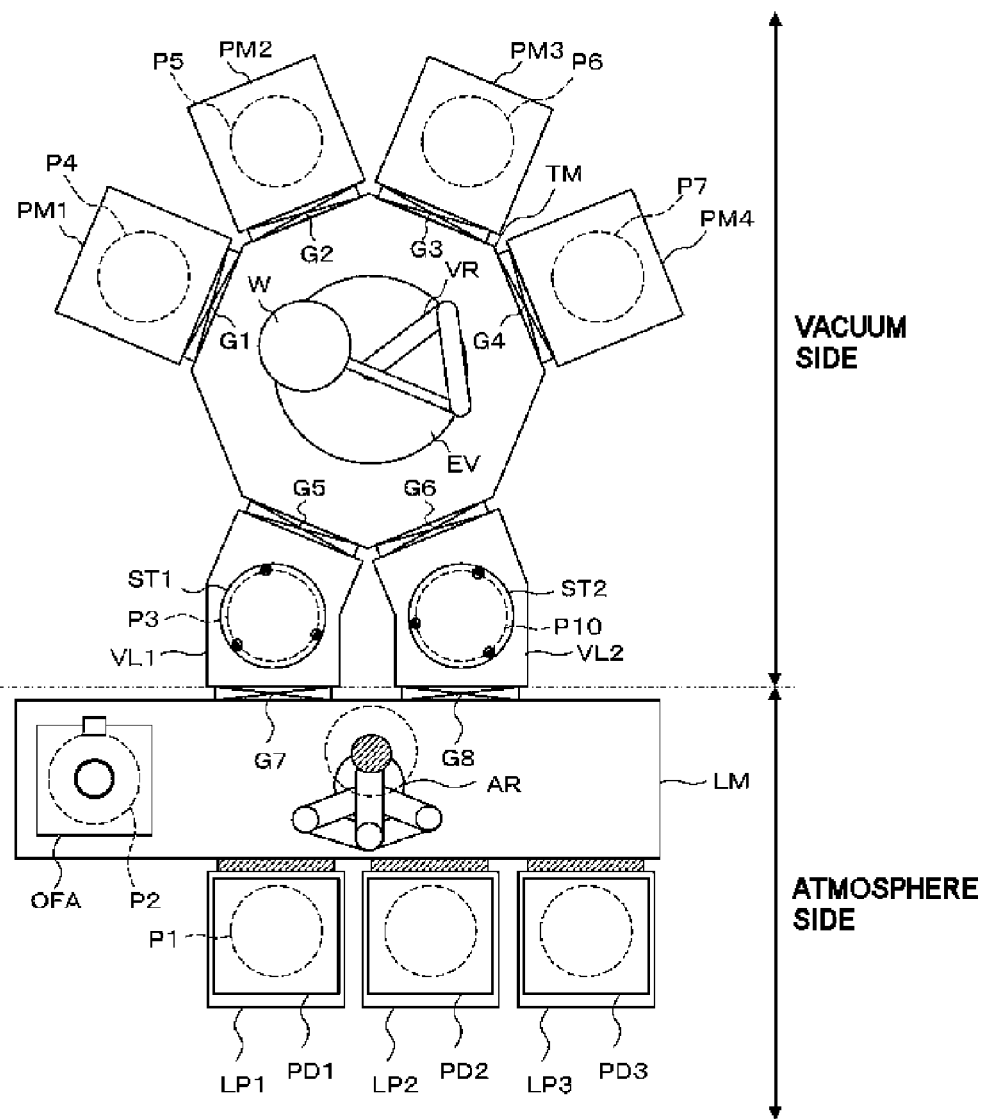
FIG. 1 is a configuration diagram schematically illustrating a cluster-type substrate processing apparatus in accordance with one embodiment of the present invention.
Figure 2:
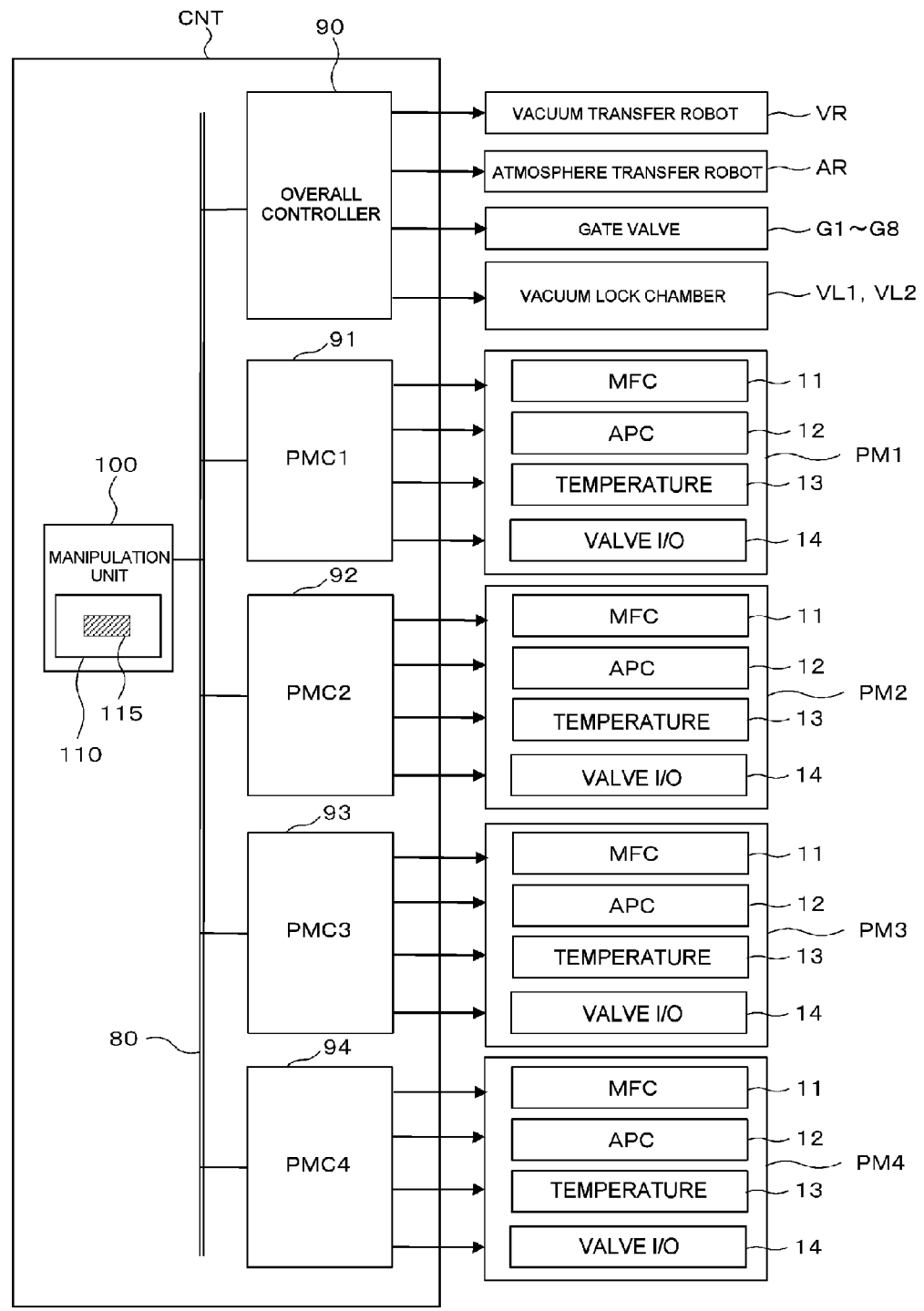
FIG. 2 is a block diagram illustrating a control means of a substrate processing apparatus in accordance with one embodiment of the present invention.

First, the configuration of the substrate processing apparatus in accordance with one embodiment of the present invention will be described with reference to FIGS. 1 and 2. FIG. 1 is a configuration diagram schematically illustrating a cluster-type substrate processing apparatus in accordance with an embodiment of the present invention. FIG. 2 is a block diagram illustrating a control means of the substrate processing apparatus in accordance with the embodiment of the present invention. The cluster-type substrate processing apparatus according to the embodiment is divided into a vacuum side and an atmosphere side.

(Configuration of the Vacuum Side)

A vacuum transfer chamber TM that is hermetically sealed at a vacuum level as a transfer chamber, vacuum lock chambers (load lock chambers) VL1 and VL2 as spare chambers, and process chambers PM1, PM2, PM3 and PM4 for processing a wafer W as a substrate are located in the vacuum side of the cluster-type substrate processing apparatus. The vacuum lock chambers VL1 and VL2 and the process chambers PM1, PM2, PM3 and PM4 are arranged in a shape like a star (a cluster type) on the outer periphery of the vacuum transfer chamber TM.

The vacuum transfer chamber TM is configured to have a load lock chamber structure, which can endure a pressure (a negative pressure) less than an atmospheric pressure such as a vacuum state. In accordance with one embodiment of the present invention, a case of the vacuum transfer chamber TM is formed in a box shape having both ends thereof closed, for example, an octagonal shape in plane view. However, the present invention is not particularly limited to such shape.

A vacuum transfer robot VR is arranged as a transfer mechanism in the vacuum transfer chamber TM. The vacuum transfer robot VR loads the wafer W on a substrate mounting portion installed in an arm and performs mutual transfer between the vacuum lock chambers VL1 and VL2 and the process chambers PM1, PM2, PM3 and PM4. In addition, the vacuum transfer robot VR is elevated by an elevator EV while maintaining the vacuum transfer chamber TM air-tight.

The process chambers PM1, PM2, PM3 and PM4 are configured to give an added value to the wafer W, for example, by performing a process of forming a thin film on the wafer W using a CVD (chemical vapor deposition) method, an ALD (atomic layer deposition) (ALD) method or PVD (physical vapor deposition) method, a process of forming an oxide film or a nitride film on a surface of the wafer, or a process of forming a metal thin film or a metal compound thin film on the wafer W. A mass flow controller (MFC) 11 for controlling a flow rate of a processing gas supplied into the process chambers PM1, PM2, PM3 and PM4, an automatic pressure controller (APC) 12 for controlling an inner pressure of the process chambers, a temperature regulator 13 for controlling an inner temperature of the process chambers, an input/output (I/O) valve 14 for controlling the on/off of a valve for supplying or exhausting a processing gas, etc. are fixed in each of the process chambers PM1, PM2, PM3 and PM4 (see FIG. 2). These parts 11, 12, 13 and 14 are controlled by process module controllers 91, 92, 93 and 94 installed in each of the process chambers. The surface of the wafer W is configured to be processed by supplying a processing gas into the process chamber PM while exhausting inside of the process chambers PM1, PM2, PM3 and PM4, and simultaneously maintaining a predetermined pressure and a predetermined temperature using the process module controllers 91, 92, 93 and 94.

In addition, the process chambers PM1, PM2, PM3 and PM4 are configured to communicate with the vacuum transfer chamber TM via gate valves G1, G2, G3 and G4, respectively. For example, when the wafer W is processed in the process chamber PM1, an inside of the process chamber PM1 is maintained in an atmosphere same as that of the vacuum transfer chamber TM, the gate valve G1 is then opened to transfer the wafer W into the process chamber PM1, and the gate valve G1 is then closed. Moreover, after predetermined processes are performed in the process chamber PM1, the inner atmosphere of the process chamber PM1 is returned to an atmosphere same as that of the vacuum transfer chamber TM, the gate valve G1 is then opened to unload the wafer W from the process chamber PM1, and the gate valve G1 is then closed. For the process chambers PM2 through PM4, the gate valves G2 through G4 perform the same switching (opening/closing) operation as the gate valve G1, which makes it possible to form the atmosphere in which the wafer W is processed.

The vacuum lock chambers VL1 and VL2 function as the spare chambers that load the wafer W into the vacuum transfer chamber TM or unload the wafer W from the vacuum transfer chamber TM. Buffer stages ST1 and ST2 for temporarily supporting the wafer W to load or unload the substrate are located inside the vacuum lock chambers VL1 and VL2, respectively. Although not shown, a cooling mechanism for cooling the wafer W is also located in each of the vacuum lock chambers VL1 and VL2. Further, a cooling chamber may be located in addition to the vacuum lock chambers VL1 and VL2.

The vacuum lock chambers VL1 and VL2 are configured to communicate with the vacuum transfer chamber TM via gate valve G5 and G6, respectively, and also configured to communicate with an atmosphere transfer chamber LM to be described later via gate valves G7 and G8, respectively. In order to keep the vacuum state of the vacuum transfer chamber TM and an atmospheric pressure state of the atmosphere transfer chamber LM, one of the gate valves G5 and G7 and one of the gate valves G6 and G8, which are fixed in the vacuum lock chambers VL1 and VL2, should be closed, and both of them should not be opened at the same time. For example, when the gate valve G5 of the vacuum transfer chamber TM side is opened, the gate valve G7 disposed on an opposite side of the gate valve G5 remains closed so as to keep an inner atmosphere of the vacuum lock chamber VL1 in the vacuum state. In addition, the term "vacuum" herein refers to an industrial vacuum. Further, when the gate valve G7 of the atmosphere transfer chamber LM side is opened, the gate valve G5 disposed on an opposite side of the gate valve G7 remains closed so as to keep an inner atmosphere of the vacuum lock chamber VL1 in an atmospheric atmosphere. Therefore, when the gate valves G5 and G6 remain closed and the gate valves G7 and G8 are opened, the wafer W may be transferred between the vacuum lock chambers VL1 and VL2 and the atmosphere transfer chamber LM while keeping the vacuum state of the vacuum transfer chamber TM.

Moreover, the vacuum lock chambers VL1 and VL2 are configured to have the load lock chamber structure which can endure a negative pressure less than an atmospheric pressure such as the vacuum state, and may be exhausted into the vacuum respectively. Therefore, when the gate valves G7 and G8 are closed to exhaust the vacuum lock chambers VL1 and VL2 into a vacuum, and then opened, the wafer W may be transferred between the vacuum lock chambers VL1 and VL2 and the vacuum transfer chamber TM while maintaining the vacuum state of the vacuum transfer chamber TM.

(Configuration of Atmosphere Side)

In addition, the atmosphere transfer chamber LM connected to the vacuum lock chambers VL1 and VL2 and load ports LP1 through LP3 connected as substrate receiving units to the atmosphere transfer chamber LM are located in the atmosphere side of the cluster-type substrate processing apparatus. Pods PD1 through PD3 are mounted as substrate receiving containers onto the load ports LP1 through LP3. As a receiving unit for receiving the wafer W, a plurality of slots is installed in each of the pods PD1 through PD3.

One atmosphere transfer robot AR is located as an atmosphere transfer mechanism in the atmosphere transfer chamber LM. The atmosphere transfer robot AR is configured to perform a mutual transfer of the wafer W as the substrate between the vacuum lock chambers VL1 and VL2 and the pods PD1 through PD3 mounted onto the load ports LP1 through LP3. The atmosphere transfer robot AR also has an arm as a substrate mounting portion disposed in the same manner as in the vacuum transfer robot VR.

In addition, an orientation flat aligner (OFA) for performing a position alignment of a crystal orientation of the wafer W as a substrate position correction device is fixed inside the atmosphere transfer chamber LM. Further, a notch aligner (not shown) for performing the position alignment of the crystal orientation of the wafer W using notches formed in the wafer W may be fixed instead of the OFA.

(Configuration of Control Means)

The respective components of the cluster-type substrate processing apparatus are controlled by a control means CNT. FIG. 2 exemplifies a configuration of the control means CNT. The control means CNT includes an overall controller 90 as an integrated controller. Further, the control means CNT includes a process module controller PMC1 91 as a process controller, a process module controller PMC2 92 as a process controller, a process module controller PMC3 93 as a process controller, and a process module controller PMC4 94 as a process controller. Further, the control means CNT includes a manipulation unit 100 for accepting a manipulation by an operator.

The process module controllers PMC1 91, PMC2 92, PMC3 93 and PMC4 94 are connected to the process chambers PM1, PM2, PM3 and PM4, respectively, and configured to individually control the processing of the substrate in the process chambers PM1, PM2, PM3 and PM4. More particularly, each of the process module controllers 91, 92, 93 and 94 is connected to an MFC 11, an APC 12, a temperature regulator 13, and an I/O valve 14 which are included in each of the process chambers PM1, PM2, PM3 and PM4. Moreover, the process module controllers 91, 92, 93 and 94 are configured to control each operation of processing mechanisms (a gas introduction/exhaust mechanism, a temperature control/plasma discharge mechanism, etc.) located in the process chambers PM1, PM2, PM3 and PM4.

The overall controller 90 is configured to be connected to the process module controllers 91, 92, 93 and 94 via a LAN cable 80, and also is connected to the vacuum transfer robot VR, the atmosphere transfer robot AR, the gate valves G1 through G8, and the vacuum lock chambers VL1 and VL2. Further, the overall controller 90 is configured to control operations of the vacuum transfer robot VR and the atmosphere transfer robot AR, switching operations of the gate valves G1 through G8, and exhaust operation for inside of the vacuum lock chambers VL1 and VL2. More particularly, the overall controller 90 is configured to control the operations of the vacuum transfer robot VR and the atmosphere transfer robot AR as a transfer means, the gate valves G1 through G8, etc. based on received information on a slot into which the wafer W is received among slots in the pods PD1 through PD3, information on a current position of the wafer W, and data that relate to processing conditions of the wafer W, data such as a wafer ID for identifying the wafer W, and data concerning recipes performed for each wafer W.

The manipulation unit 100 is configured to be connected to the overall controller 90 and the process module controllers 91, 92, 93 and 94 via the LAN cable 80, respectively. The manipulation unit 100 is a mainframe computer including a central processing unit (CPU), a memory as a storage device, an interface, a hard disk as a recording device, etc. An overall control program for the entire system, a PM1 manipulation program, a PM2 manipulation program, a PM3 manipulation program, and a PM4 manipulation program are stored in the hard disk of the manipulation unit 100. When the overall control program for the entire system is read into the memory from the hard disk of the manipulation unit 100, and executed by the CPU, a function of transmitting an operation instruction (message) to the overall controller 90 and simultaneously receiving an operation report (message) from the overall controller 90 is realized in the manipulation unit 100. Further, when the PM1 manipulation program, the PM2 manipulation program, the PM3 manipulation program, and the PM4 manipulation program are read into the memory from the hard disk of the manipulation unit 100, and executed by the CPU, a function of transmitting an operation instruction (message) to the process module controllers 91, 92, 93 and 94 and simultaneously receiving an operation report (message) from the process module controllers 91, 92, 93 and 94 is realized in the manipulation unit 100. In addition, the manipulation unit 100 is configured to perform screen display/input reception functions such as settings of an operation mode, monitor displaying, log-in data, alarm interpretation, and parameter editing.

A display device 110 is installed in the manipulation unit 100. A setting screen 120 having a configuration where a QC mode and a production mode are selected as an operation mode is displayed on a display unit 115 of the display device 110 (see FIGS. 3 through 5). "Monitor" (a QC mode) is an operation mode in which a quality control substrate is processed in the process chambers PM1, PM2, PM3 and PM4 after the maintenance check. "Product" (a production mode) is an operation mode in which a production substrate is processed in the process chambers PM1, PM2, PM3 and PM4. Hereinafter, the setting screen 120 will be described in detail.

(Screen Settings of Operation Mode, etc.)

For example, an input box of a sequence recipe name to assign process job information, a selection box of a substrate (a box for selecting either "Product" or "Monitor") used in each operation mode, an assigning box of a process chamber (a check box for selecting PM1 through PM4), and an input box of a process recipe name are, displayed on the configuration screen 120.

Figure 3:
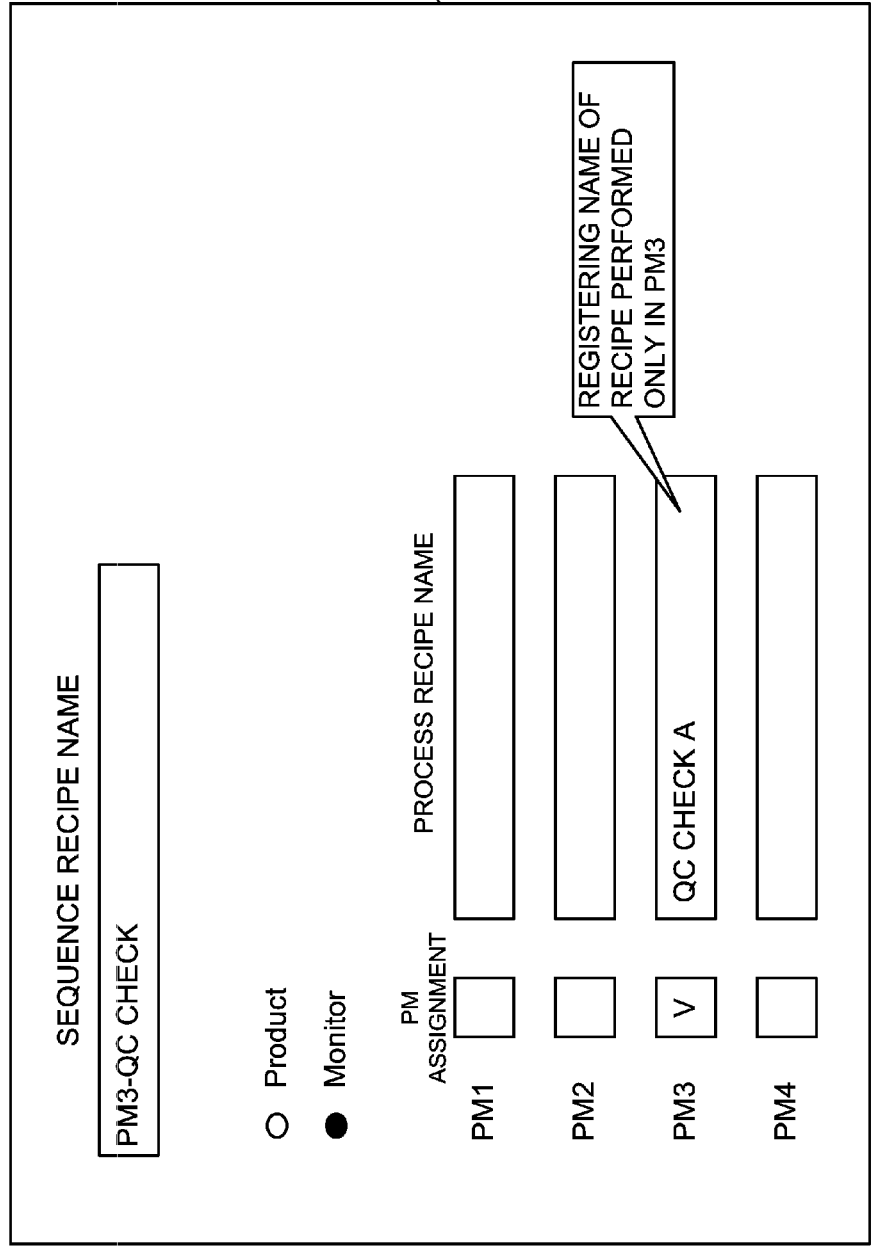
FIG. 3 is a diagram exemplifying a setting screen of a substrate processing apparatus wherein a quality control substrate (a monitoring substrate) is selected in accordance with one embodiment of the present invention.

When a quality control wafer W as a wafer for a QC check is processed in the process chamber PM3, each box of the setting screen 120 is input as shown in FIG. 3. For example, a recipe name 'PM3-QC check' for representing a QC check at the process chamber PM3 is input into the input box of a sequence recipe name. Further, "Monitor" is selected from the selection box of a substrate. Further, "PM3" is selected from the assigning box of a process chamber for representing the process chamber PM3 that performs a QC check. Further, a process recipe name "QC check A" for performing a QC check is input into the input box of a process recipe name of the process chamber PM3.

Figure 4:
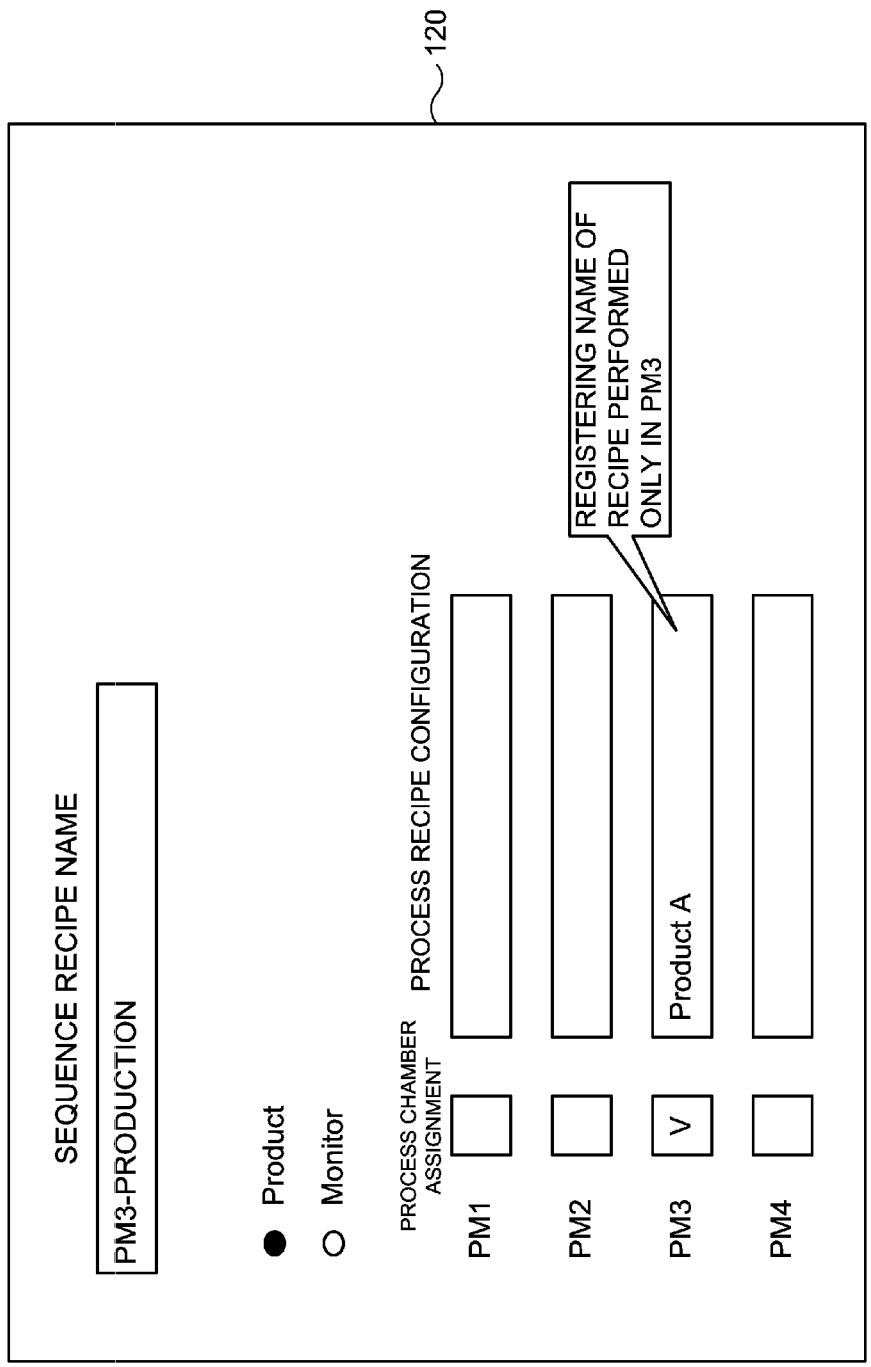
FIG. 4 is a diagram exemplifying a setting screen of a substrate processing apparatus wherein a production substrate (a product substrate) is selected in accordance with one embodiment of the present invention.

In addition, when a production wafer W is processed in the process chamber PM3, each box of the setting screen 120 is input as shown in FIG. 4. For example, a recipe name "PM3-production" for representing a production in the process chamber PM3 is input into the input box of a sequence recipe name. Further, "Product" is selected from the selection box of a substrate. "PM3" is selected from the assigning box of a process chamber for representing the process chamber PM3 that performs the production. Further, a process recipe name "Product A" for performing the production is input into the input box of a process recipe name of the process chamber PM3.

Figure 5:
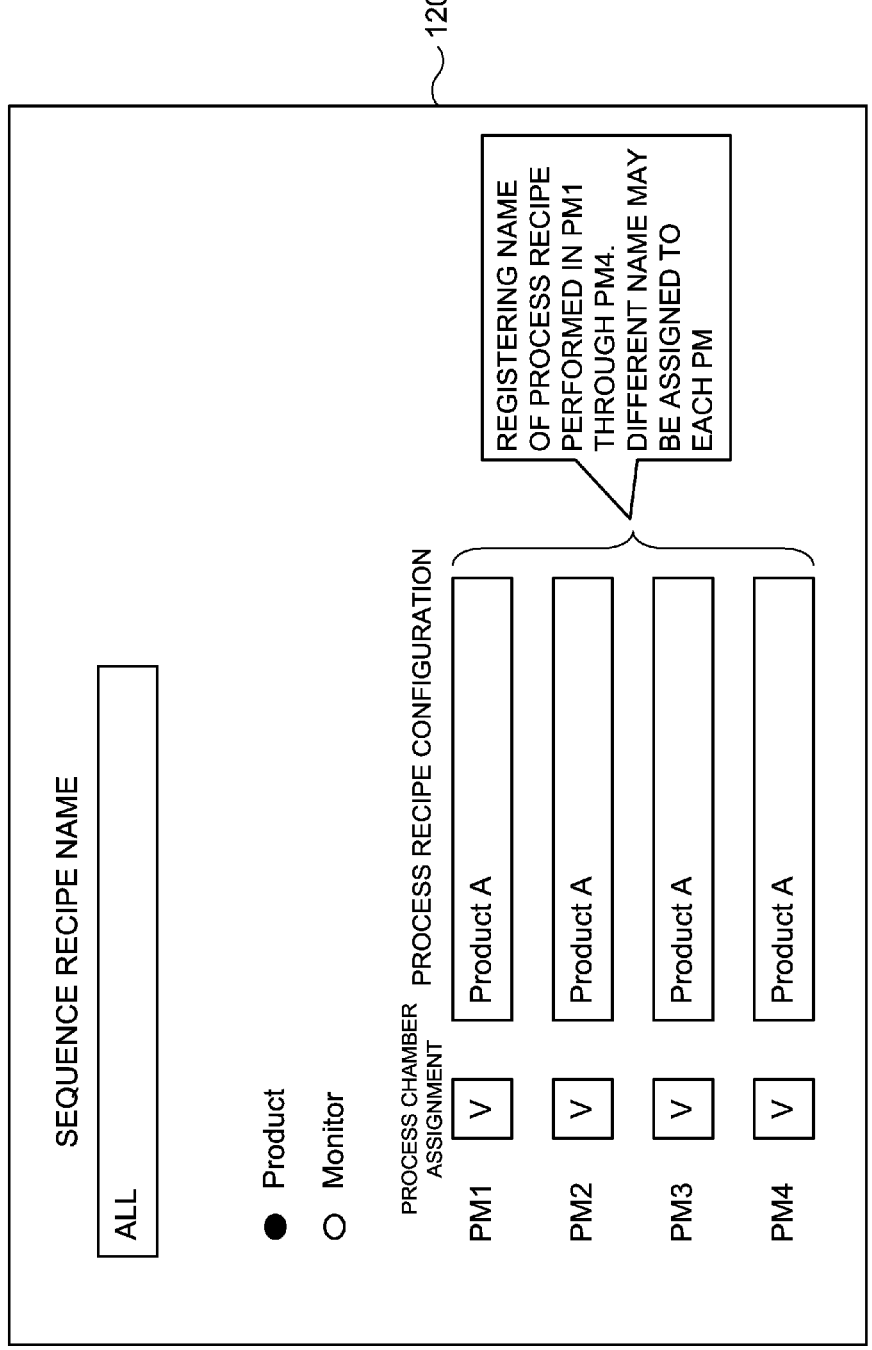
FIG. 5 is a diagram exemplifying a setting screen of a substrate processing apparatus wherein a production substrate (product substrate) is selected for every process chamber in accordance with one embodiment of the present invention.

In addition, when the production wafer W is processed in all of the process chambers PM1, PM2, PM3 and PM4, each input box of the setting screen 120 is input as shown in FIG. 5. For example, a recipe name "ALL" for performing production at the process chambers PM1, PM2, PM3 and PM4 is input into the input box of a sequence recipe name. Further, "Product" is selected from the selection box of a substrate.

Further, all of the process chambers "PM1", "PM2", "PM3" and "PM4" for performing the production are selected from the assigning box of the process chamber. Further, a recipe name "Product A" for performing production is input into the input box of a process recipe name of the process chamber PM1 through PM4. In this case, the process recipes may be set by changing the process recipes in every process chamber. Although not shown herein, the above-described "Product A" may be, for example, input into the input boxes of the process recipe names of the process chambers PM1 and PM2, and "Product B" may be input into the input boxes of the process recipe names of the process chambers PM3 and PM4, respectively. Although not shown herein, two or three of "PM1," "PM2," "PM3" and "PM4" may be selected and assigned to apply two or three process chambers to a production mode.

(2) Substrate Processing Process

Next, an example of the substrate processing process performed by the substrate processing apparatus according to the embodiment will be described with reference to FIGS. 6 and 7.

Figure 6:
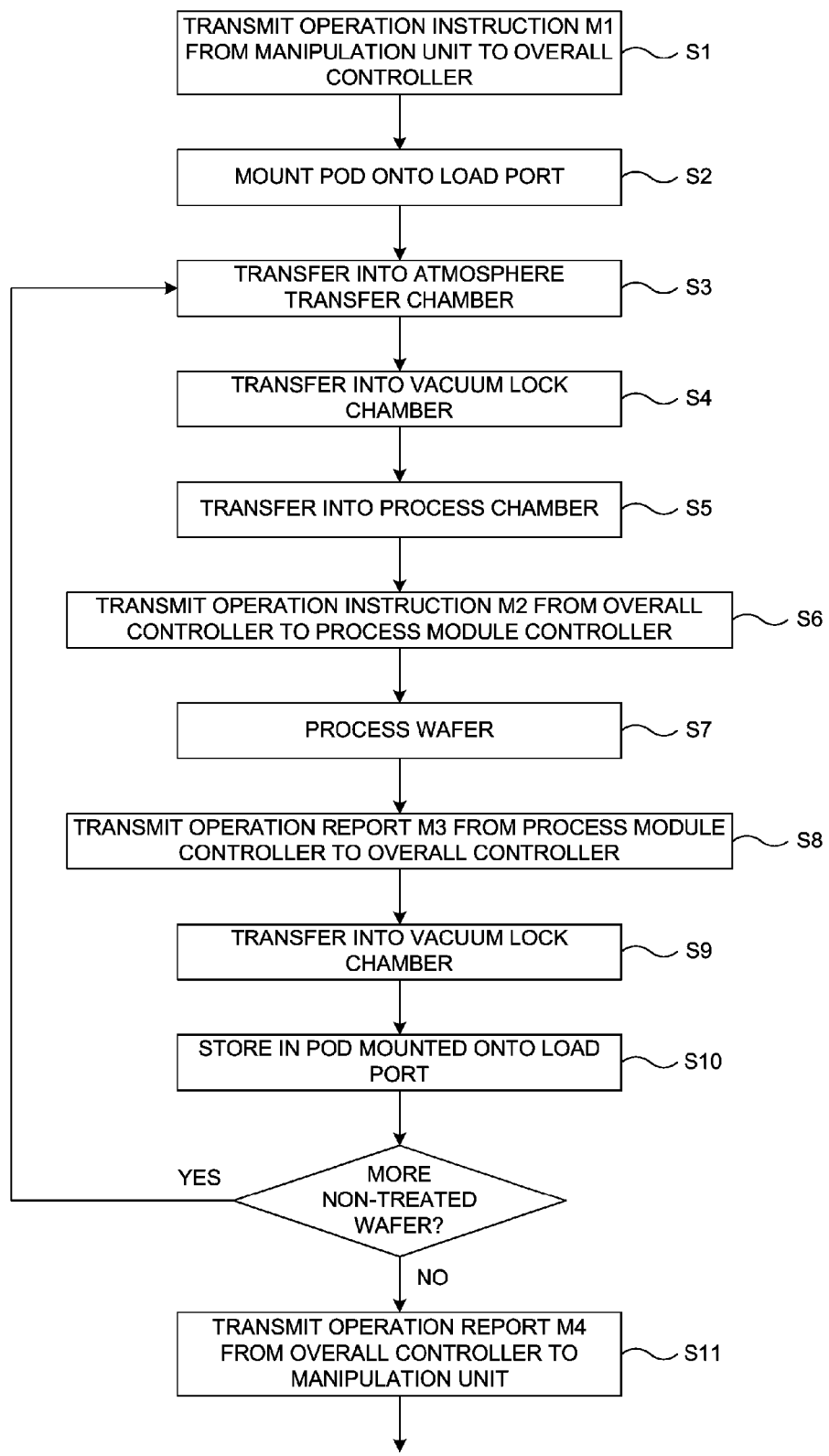
FIG. 6 is a flow diagram illustrating a substrate processing process performed in a substrate processing apparatus in accordance with one embodiment of the present invention.

FIG. 6 is a flow diagram illustrating a substrate processing process performed in the substrate processing apparatus in accordance with one embodiment of the present invention. FIG. 7 is a diagram schematically illustrating an operation of the control means in the substrate processing apparatus in accordance with one embodiment of the present invention. Dotted line shown in FIG. 7 represents transmission/reception of a message in the substrate processing apparatus.

Figure 7:
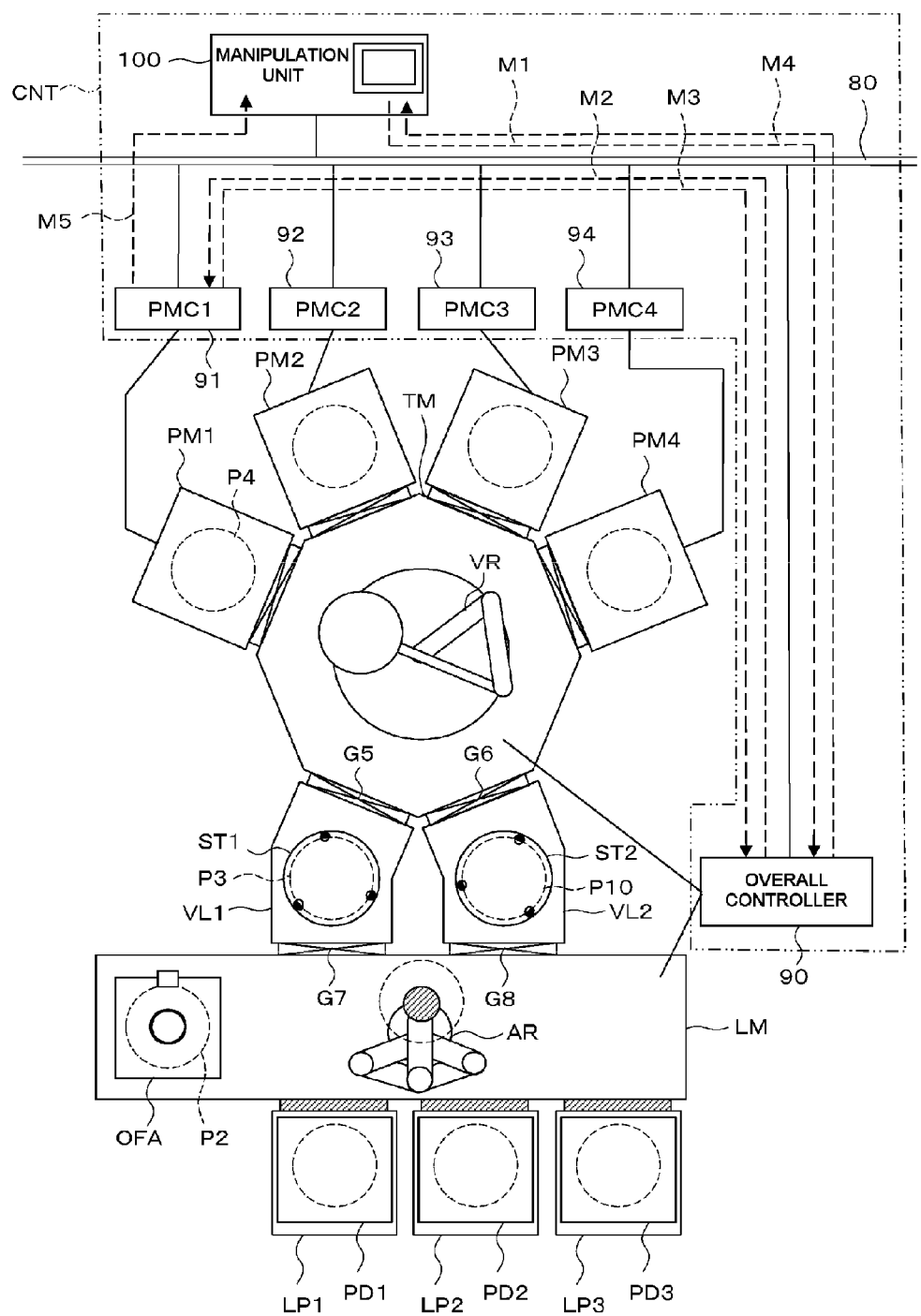
FIG. 7 is a diagram schematically illustrating an operation of a control means in a substrate processing apparatus in accordance with one embodiment of the present invention.

As shown in FIGS. 6 and 7, an operation instruction M1 for starting a substrate processing is transmitted from the manipulation unit 100 to the overall controller 90 via the LAN 80 (S1).

The overall controller 90 having received the operation instruction M1 closes the gate valves G5 and G8 and opens the gate valves G6 and G7 to exhaust the vacuum transfer chamber TM and the process chambers PM1, PM2, PM3 and PM4 into the vacuum level. Next, the overall controller 90 supplies a clean air into the atmosphere transfer chamber LM so that an inner pressure of the atmosphere transfer chamber LM is nearly equivalent to an atmospheric pressure. The pod PD1 receiving a plurality of non-treated wafers W is then mounted onto the load port LP1 by means of a transfer device (not shown) (S2).

Next, the overall controller 90 transfers the wafer W, which is placed in a substrate position P1 inside the pod PD1 mounted onto the load port LP1, into the atmosphere transfer chamber LM using the atmosphere transfer robot AR, places the wafer W in a substrate position P2 on the OFA, and performs a position adjustment of crystal orientation, etc. (S3).

Subsequently, the overall controller 90 picks up the wafer W placed in the substrate position P2, transfers the wafer W into the vacuum lock chamber VL1, and places the wafer W in a substrate position P3 on the buffer stage ST1 using the atmosphere transfer robot AR. Thereafter, the overall controller 90 closes the gate valve G7 and exhausts an inner part of the vacuum lock chamber VL1 into a vacuum (S4).

When the inner pressure of the vacuum lock chamber VL1 is reduced to a predetermined pressure, the overall controller 90 opens the gate valve G5 while the gate valve G7 remains closed. Thereafter, the overall controller 90 picks up the wafer W placed in the substrate position P3, transfers the wafer W into the process chamber PM1, and places the wafer W in a substrate position P4 using the atmosphere transfer robot AR (S5).

When the wafer W is loaded into the process chamber PM1, the overall controller 90 transmits an operation instruction M2, which starts the substrate processing recipe, to the process module controller 91 via the LAN 80 (S6).

The process module controller 91 supplies a processing gas into the process chamber PM1, and performs a predetermined processing (film formation, etc.) on the wafer W (S7).

When the processing of the wafer W is completed, the process module controller 91 transmits an operation report M3 indicating that the processing of the wafer W is completed to the overall controller 90 via the LAN 80 (S8).

The overall controller 90 having received the operation report M3 opens the gate valve G5 while the gate valve G7 remains closed, picks up the processed wafer W placed in the substrate position P4 and transfers the wafer W into the vacuum lock chamber VL2 using the vacuum transfer robot VR.

After the processed wafer W is disposed in a substrate position P10 on the buffer stage ST2, the overall controller 90 closes the gate valve (G6), supplies a clean gas into the vacuum lock chamber VL2 so that the inner pressure of the vacuum lock chamber VL2 can return to a near atmospheric pressure, and opens the gate valve G8 (S9). Further, the wafer W is then cooled by a cooling mechanism (not shown).

Thereafter, the overall controller 90 picks up the processed wafer W placed in the substrate position P10, transfers the wafer W into the pod PD3 mounted on the load port LP3, and places the wafer W into an empty slot using the atmosphere transfer robot AR (S10).

Thereafter, when the above-described processes are repeated to perform an automatic transfer of all of non-treated wafers W, the overall controller 90 unloads the pod PD3 holding the processed wafer W from the load port LP3. Thereafter, the overall controller 90 transmits an operation report M4 indicating that the substrate processing instructed by an operator is completed to the manipulation unit 100 via the LAN 80, and then the substrate processing is finished (S11).

In the above-described processes (S1 through S11), a monitor data or alarm (message M5) transmitted from the process module controllers (PMC1 91, PMC2 92, PMC3 93 and PMC4 94) is also directly transmitted into the manipulation unit 100 without passing through the overall controller 90.

Although the process chamber PM1 has been described in the above-mentioned description, other process chambers (PM2, PM3 and PM4) may also perform processing of the wafer W in the same manner as in the process chamber PM1.

(3) Maintenance Process through Production Process

Next, one example of the maintenance process through the production process performed by the substrate processing apparatus according to the embodiment will be described with reference to FIGS. 8 and 9.

Figure 8:
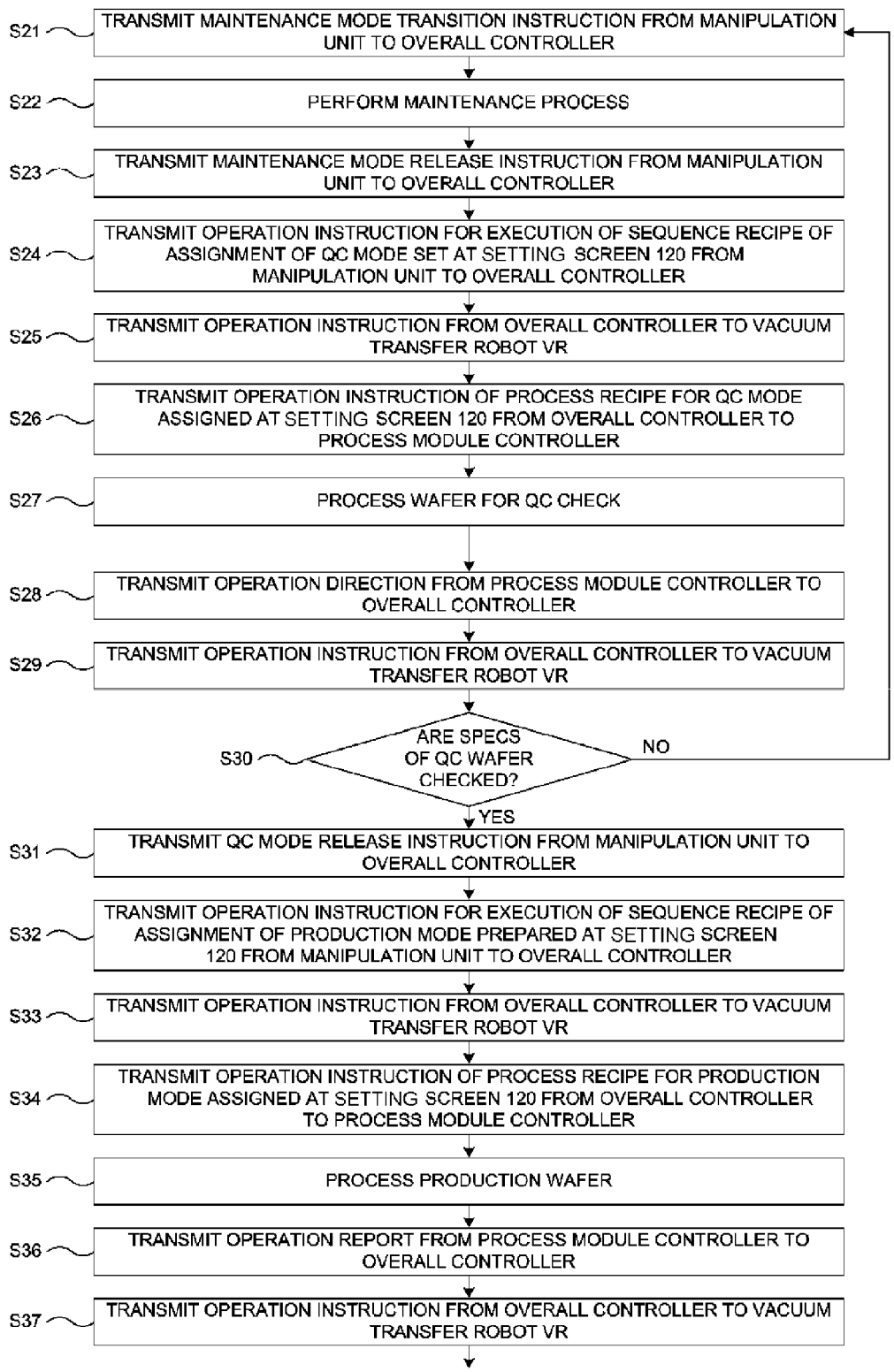
FIG. 8 is a flow diagram illustrating a transition procedure of an operation mode of a process chamber performed in a substrate processing apparatus in accordance with one embodiment of the present invention.
Figure 9:
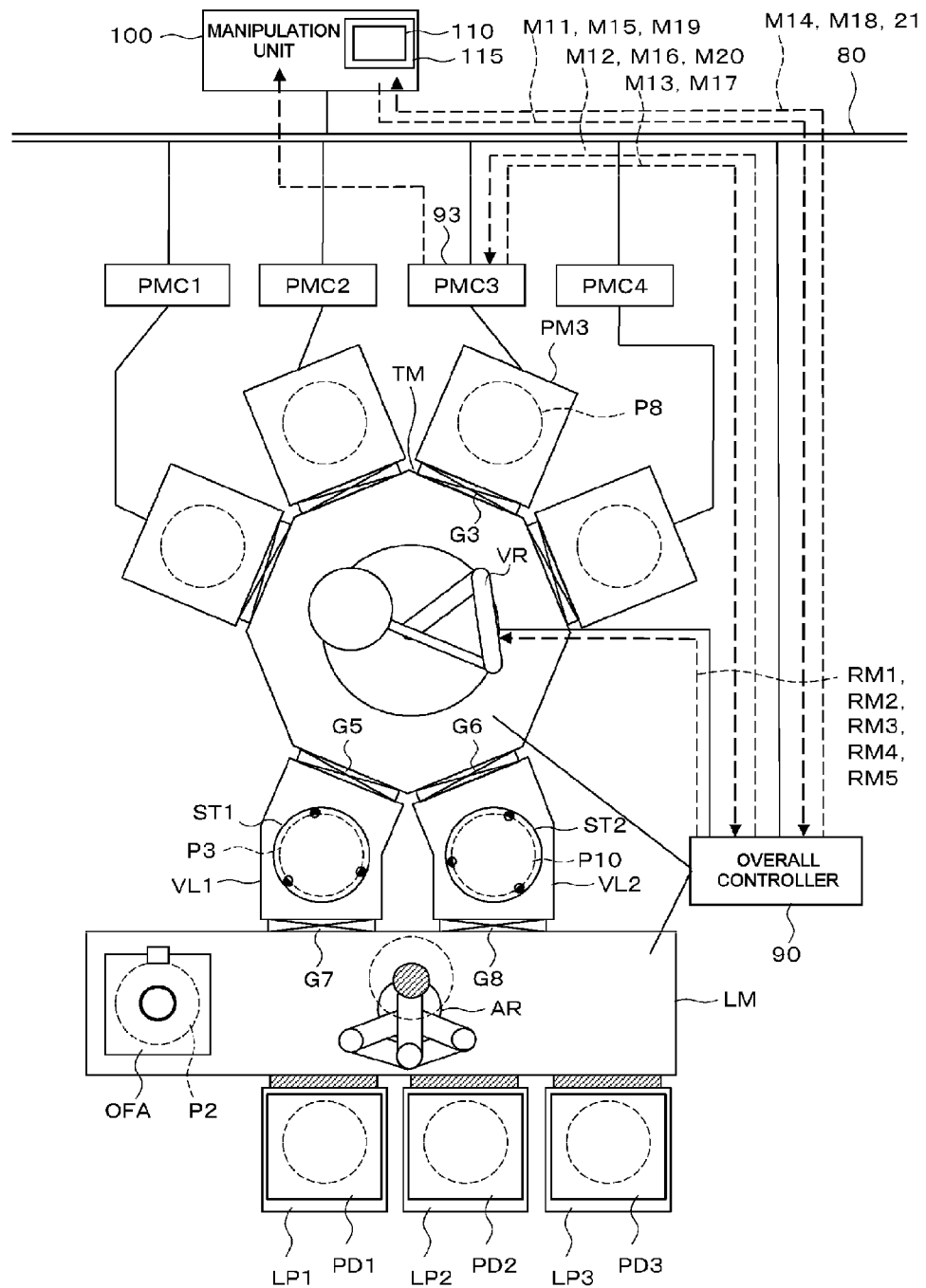
FIG. 9 is a diagram illustrating a flow in each operation mode performed in a substrate processing apparatus in accordance with one embodiment of the present invention.

FIG. 8 is a flow diagram illustrating a maintenance process through a production process performed in the substrate processing apparatus in accordance with one embodiment of the present invention. FIG. 9 is a schematic diagram illustrating an operation of the substrate processing apparatus in the maintenance process through the production process in accordance with one embodiment of the present invention. Dotted line shown in FIG. 9 represents the transmission/reception of a message in the substrate processing apparatus.

A maintenance task is suitably performed in the process chambers PM1, PM2, PM3 and PM4 in which the production wafer W is processed as many as a predetermined number of times, depending on the contamination of the insides of the process chambers. The maintenance task is performed without separating the process chambers PM1, PM2, PM3 and PM4 from the vacuum transfer chamber TM. Targets of this maintenance task are, for example, an erroneous operation of an alarm informing of abnormalities caused by a slight degradation of a vacuum attainment level by adhesion of gas molecules or reaction products to wall of the process chambers PM1, PM2, PM3 and PM4, a deterioration of sensitivity by slight adhesion of contaminants to a surface of a sensor, etc. A maintenance method of solving the slight degradation of the vacuum attainment level and the slight adhesion of the contaminants may include plasma cleaning, cleaning by etching, etc. The term "slight" used herein means a level which can be removed by the cleaning. Further, the maintenance task includes separating the process chambers PM1, PM2, PM3 and PM4 from the vacuum transfer chamber TM. Further, advantages obtained by performing the maintenance task without separating the process chambers PM1 through PM4 from the vacuum transfer chamber TM are as follows: a disassembling task and an installation task of the process chambers PM1 through PM4 are not required, and a maintenance time can be reduced. When the process chambers PM1 through PM4 are separated and the maintenance tasks are performed, the disassembling task and the installation task of the process chambers PM1 through PM4 are required, resulting in more maintenance time.

[Transmission of Maintenance Mode Transition Instruction (S21)]

In order to perform a maintenance task of the process chamber PM3, for example, the operator calls the setting screen 120 on the display unit 115 of the display device 110, and inputs "PM3-maintenance" into an input box of a sequence recipe name. Further, a process chamber "PM3" for executing the maintenance task is selected from an assigning box of the process chamber. Further, "maintenance A" is input as a process recipe name of the executed maintenance task into an input box of a process recipe name of the process chamber PM3.

As a result, a transition instruction M11 to a maintenance mode is transmitted from the manipulation unit 100 to the overall controller 90 via the LAN 80. Further, the overall controller 90 received the transition instruction M11 is configured to reject a request of a transition instruction to a QC mode or a production mode for the process chamber PM3 in case that the overall controller 90 receives this transition instruction from the manipulation unit 100 until a maintenance process is completed (until it receives an operation report M13 to be described later).

[Execution of Maintenance Process (S22)]

The overall controller 90 transmits a command to the process module controller 93, and closes the gate valve G3. Further, the overall controller 90 transmits a vacuum transfer robot operation instruction RM1, which inhibits the transfer of the wafer W into the process chamber PM3 to which "maintenance mode" is assigned, to the vacuum transfer robot VR. The vacuum transfer robot VR received the vacuum transfer robot operation instruction RM1 cannot transfer the wafer W (the production wafer W and the quality control wafer W) into the process chamber PM3. Therefore, the maintenance task of the process chamber PM3 can be performed. Further, when the operation instruction M11 is received, and the wafer W being introduced into the process chamber PM3 is sensed by a wafer presence sensor (not shown), the inner atmosphere of the process chamber PM3 is adjusted to a vacuum atmosphere equivalent to that of the vacuum transfer chamber TM, and the gate valve G3 is then opened to extract the wafer W using the vacuum transfer robot VR.

Thereafter, the overall controller 90 transmits an operation instruction M12, which instructs a start of "maintenance A" that is a process recipe of the maintenance task, to the process module controller 93 via the LAN 80. The process module controller 93 received the operation instruction M12 performs a predetermined maintenance process (for example, a plasma cleaning process, a cleaning process by etching, etc.) on the process chamber PM3.

When the maintenance process is completed, the process module controller 93 transmits the operation report M13, which indicates that the maintenance process is completed, to the overall controller 90 via the LAN 80. The overall controller 90 received the operation report M13 transmits an operation report M14, which indicates that the maintenance task is completed, to the manipulation unit 100 via the LAN 80, and displays this effect on the display unit 115. Further, it may be desirable to inform that the maintenance task is completed by means of a sound together with the displaying.

[Transmission of Operation Instructions for Release of Maintenance and Execution of Sequence Recipe (S23, S24)]

After a manipulator checks the end of the maintenance task, the manipulator displays the setting screen 120 (see FIG. 3) on the display unit 115 of the display device 110 and inputs items to each box of the setting screen 120, as shown in FIG. 3. That is, a recipe name "PM3-QC check" for performing a QC check at the process chamber PM3 is input into the input box of a sequence recipe name. Further, "Monitor" is selected from the selection box of a substrate. Further, a process chamber "PM3" for performing a QC check is selected from the assigning box of a process chamber. Further, a process recipe name "QC check A" for performing a QC check is input into the input box of a process recipe name of the process chamber PM3.

As a result, an operation instruction that instructs the release of a maintenance mode (i.e., an initiation of a QC mode) and an operation instruction M15 for execution of the sequence recipe "PM3-QC check" input into the setting screen 120 are transmitted from the manipulation unit 100 to the overall controller 90 via the LAN 80. Therefore, the operation mode of the process chamber PM3 is transitioned from the "maintenance mode" to the "QC mode" to start the execution of a sequence recipe "PM3-QC check." Also, the overall controller 90 received the operation instruction M15 is configured to reject a request of a transition instruction to a QC mode or a production mode for the process chamber PM3 in case that the overall controller 90 receives the operation instruction from the manipulation unit 100 until the execution of the sequence recipe "PM3-QC check" is completed (until it receives an operation report M17 to be described later).

[Transmission of Vacuum Transfer Robot Operation Instruction (S25)]

The overall controller 90 received the operation instruction M15 transmits a vacuum transfer robot operation instruction RM2, which permits the transfer of the quality control wafer W and inhibits the transfer of the production wafer W into the process chamber PM3 to which the "QC mode" is assigned, to the vacuum transfer robot VR.

The vacuum transfer robot VR having received the vacuum transfer robot operation instruction RM2 may not transfer the production wafer W, but may transfer the quality control wafer W into the process chamber PM3. Further, the vacuum transfer robot VR transfers the quality control wafer W in the wafer transfer order as described with reference to FIG. 6 so as to transfer the quality control wafer W to the process chamber PM3. That is, the wafer transfer is performed in the order of the mounting of the pod on the load port (S2), the transfer to the atmosphere transfer chamber (S3), the transfer to the vacuum lock chamber (S4), and the transfer to the process chamber (S5), as described above.

[Transmission of Process Recipe Operation Instruction of QC Mode (S26)]

When the quality control wafer W is loaded into the process chamber PM3, the overall controller 90 transmits an operation instruction M16, which instructs a start of a process recipe "QC check A," to the process module controller 93 via the LAN 80.

[Processing of Wafer for QC Check (S27)]

The process module controller 93 received the operation instruction M16 performs the process recipe "QC check A" on the process chamber PM3 to process the quality control wafer W (for example, film formation, etc.).

[Transmission of Operation Report (S28)]

When the processing of the quality control wafer W is completed, the process module controller 93 transmits an operation report M17, which indicates that the processing of the quality control wafer W is completed, to the overall controller 90 via the LAN 80. The overall controller 90 received the operation report M17 transmits an operation report M18, which indicates that the processing of the quality control wafer W is completed, to the manipulation unit 100 via the LAN 80, and displays this effect on the display unit 115. Further, it may be desirable to inform that the processing is completed by means of a sound together with the displaying.

[Transmission of Vacuum Transfer Robot Operation Instruction (S29)]

The overall controller 90 received the operation instruction M17 transmits a vacuum transfer robot operation instruction RM3, which unloads the processed wafer W for QC check, to the vacuum transfer robot VR. In order to unload the quality control wafer W, the wafer transfer is performed in the order described with reference to FIG. 6. That is, the wafer transfer is performed in the order of the transfer to the vacuum lock chamber (S9) and the storing into the pod mounted on the load port (S10).

[Checking of Wafer Spec (S30)]

A quality of the quality control wafer W is inspected after the processing. As one example, a quality inspection is performed by measuring a thickness of a film formed on the quality control wafer W or measuring the number of particles adhered to the quality control wafer W. The quality inspection may be performed after the quality control wafer W is unloaded from the substrate processing apparatus, or be performed in the process chamber.

[Transmission of Operation Instruction for Release of QC Mode and Execution of Sequence Recipe (S31, S32)]

As the inspection results, when the thickness of the film formed on the quality control wafer W or the number of particles present on a surface of the film is out of the predetermined specs ("No" from S30), a manipulator performs the above-described processes again from the transmission of the maintenance mode transition instruction (S21).

As the inspection results, when the thickness of the film and the number of the particles are within the predetermined specs ("Yes" from S30), the manipulator also displays the setting screen 120 (see FIG. 3) on the display unit 115 of the display device 110, and inputs items for each box of the setting screen 120 as shown in FIG. 4. That is, a recipe name "PM3-Production" for performing production at the process chamber PM3 is input into the input box of a sequence recipe name. Further, "Product" is selected from the selection box of a substrate. Further, a process chamber "PM3" for performing production is selected from the assigning box of a process chamber. Further, a process recipe name "Product A" for performing production is input into the input box of a process recipe name of the process chamber PM3.

As a result, an operation instruction which instructs the release of a QC mode (i.e., a start of a production mode) and an operation instruction M19 for execution of the sequence recipe "PM3-QC check" input into the setting screen 120 are transmitted from the manipulation unit 100 to the overall controller 90 via the LAN 80. Therefore, the operation mode of the process chamber PM3 is transitioned from the "QC mode" to the "production mode" and the execution of a sequence recipe "PM3-Production" is stared. Also, the overall controller 90 received the operation instruction M19 is configured to reject a request of a transition instruction to a maintenance mode or a QC mode for the process chamber PM3 when receiving the transition instruction from the manipulation unit 100 until the execution of the production mode is completed (until it receives an operation report M20 to be described later). Such a transition from the "QC mode" to the "production mode" may be achieved only by screen manipulation on the setting screen 120. Therefore, it is impossible to perform the transition to the "production mode" without being handled by the manipulator.

[Transmission of Vacuum Transfer Robot Operation Instruction (S33)]

The overall controller 90 received the operation instruction M19 transmits a vacuum transfer robot operation instruction RM4, which permits the transfer of the production wafer W into the process chamber PM3 to which the "production mode" is assigned, to the vacuum transfer robot VR.

The vacuum transfer robot VR received the vacuum transfer robot operation instruction RM4 can transfer the production wafer W into the process chamber PM3. Further, the overall controller 90 transfers the production wafer W in the transfer order of the wafer W described with reference to FIG. 6 so as to transfer the production wafer W to the process chamber PM3. That is, the wafer transfer is executed in the order of the mounting of the pod on the load port (S2) through the transfer to the process chamber (S5), as described above.

[Transmission of Process Recipe Operation Instruction of Production Mode (S34)]

When the production wafer W is loaded into the process chamber PM3, the overall controller 90 transmits an operation instruction M20, which instructs a start of a production recipe, to the process module controller 93 via the LAN 80.

[Processing Production wafer (S35)]

The process module controller 93 received the operation instruction M20 executes a process recipe "Product A" at the process chamber PM3 to process the production wafer W (for example, film formation, etc.).

[Transmission of Operation Report (S36)]

When the processing of the production wafer W is completed, the process module controller 93 transmits an operation report M20, which indicates that the processing of the production wafer W is completed, to the overall controller 90 via the LAN 80. The overall controller 90 received the operation report M20 transmits an operation report M21, which indicates that the processing of the production wafer W is completed, to the manipulation unit 100 via the LAN 80, and displays this effect on the display unit 115. Further, it may be desirable to inform that the processing is completed by means of a sound together with the displaying.

[Transmission of Vacuum Transfer Robot Operation Instruction (S37)]

The overall controller 90 received an operation instruction M22 transmits a vacuum transfer robot operation instruction RM5 to unload the processed production wafer W to the vacuum transfer robot VR. In order to unload the production wafer W, the wafer transfer is then performed in the order described with reference to FIG. 6. That is, the transfer of the production wafer W is performed in the order of the transfer to the vacuum lock chamber (S9) and the storing into the pod mounted on the load port (S10).

Figure 10:
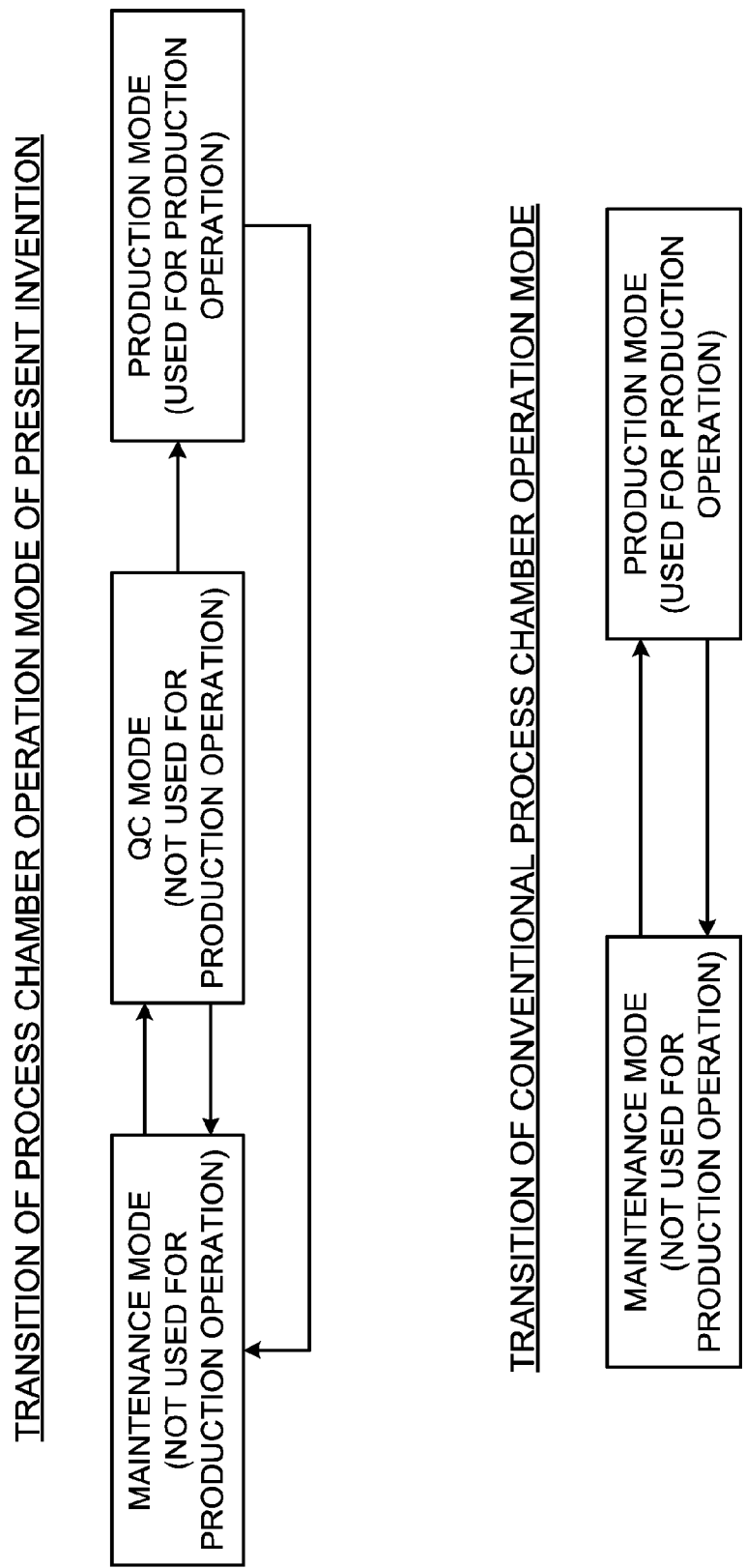
FIG. 10 is a diagram illustrating flows of operation modes of a substrate processing apparatus in accordance with one embodiment of the present invention and a conventional substrate processing apparatus.

As described above, the substrate processing apparatus of the present invention includes a "QC mode" in addition of the "maintenance mode" and the "production mode" as the operation mode, as shown in FIG. 10. Here, the transfer of the wafer W to the process chamber to which the "maintenance mode" is assigned is inhibited. Further, the transfer of the production wafer W to the process chamber to which the "QC mode" is assigned is inhibited, and the transfer of the quality control wafer W is permitted. Further, the transfer of the quality control wafer W to the process chamber to which the "production mode" is assigned is inhibited, and the transfer of the production wafer W is permitted. Therefore, there is no possibility of transferring the production wafer W to the process chamber which the "QC mode" is assigned during the QC check. Further, there is no possibility of transferring the quality control wafer W to the process chamber performing the production process. In the conventional substrate processing apparatus, only the "maintenance mode" and the "production mode" are operated for the maintenance task, the QC check and the production.

(4) Operation method of Process Chamber during Automatic Operation

Next, one example of the operation method of the process chamber during an automatic operation will be described with reference to FIGS. 11 through 13, as follows.

[Application of Whole Process Chambers]

Figure 11:
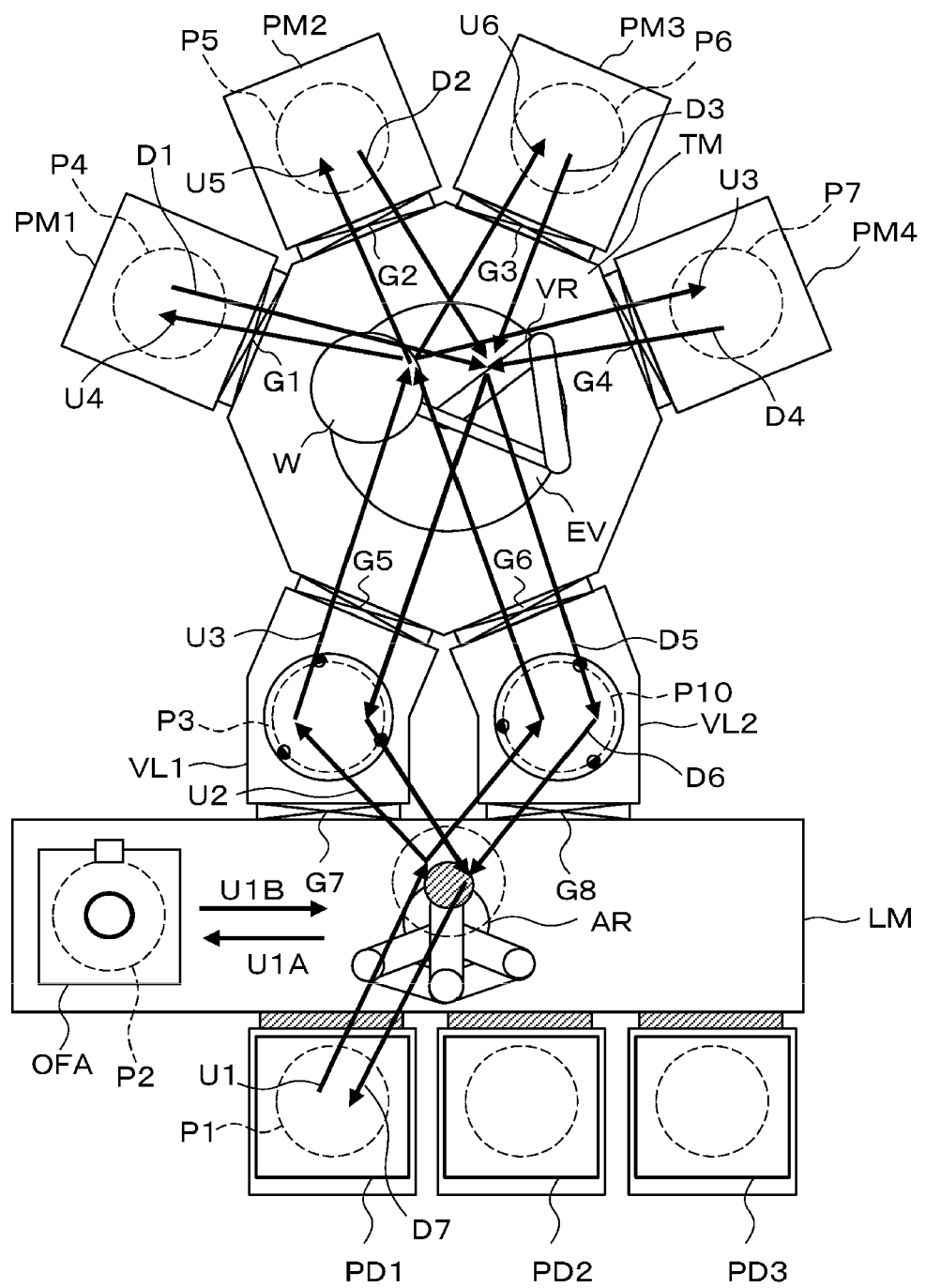
FIG. 11 is a configuration diagram schematically exemplifying an operation scheme of process chambers when a substrate processing apparatus according is operated automatically in accordance with one embodiment of the present invention.

As shown in FIG. 11, when a sequence recipe for applying the whole process chambers PM1, PM2, PM3 and PM4 is instructed, for example, the wafer processing is executed in the process chambers in the order of process chamber PM1→process chamber PM2→process chamber PM3→process chamber PM4. Each execution of the wafer processing is based on the substrate processing process described with reference to FIG. 6. Further, since the switching operations of the gate valves G1 through G8 are the same as in the above-described substrate processing process, a description is omitted.

The wafer W as the production substrate stored in the pod PD1, is first extracted into the atmosphere transfer chamber LM using the atmosphere transfer robot AR (arrow U1), transitioned to the substrate position P2 of the OFA (arrow U1A), and mounted onto the substrate position P2 to determine a position of the wafer W. Subsequently, the wafer W on the substrate position P2 is picked up by the atmosphere transfer robot AR, transitioned from the atmosphere transfer chamber LM (arrow U1B) to the substrate position P3 of the vacuum lock chamber VL1 whose pressure is nearly adjusted to an atmospheric pressure state, and mounted onto the substrate position P3 (arrow U2). Thereafter, when the pressure of the vacuum lock chamber VL1 is nearly adjusted to a vacuum state, the wafer W is picked up from the substrate position P3 using the vacuum transfer robot VR, passed through the vacuum transfer chamber TM whose pressure is nearly adjusted to a vacuum state (arrow U3), transferred to the substrate position P4 of the process chamber PM1 whose pressure is nearly adjusted to a vacuum state, and mounted onto the substrate position P4 (arrow U4). Thereafter, the wafer processing is executed at the process chamber PM1. While the wafer processing is executed at the process chamber PM1, another wafer W is transferred from the pod PD1 to the substrate position P5 of the process chamber PM2 and mounted onto the substrate position P5 (arrow U5), as described above. Thereafter, the wafer processing is executed. Subsequently, while the wafer processing is executed at the process chambers PM1 and PM2, a further another wafer W is transferred from the pod PD1 to a substrate position P6 of the process chamber PM3 and mounted onto the substrate position P6 (arrow U6), as described above. Thereafter, the wafer processing is executed. In turn, while the wafer processing is executed at the process chambers PM1, PM2 and PM3, a further another wafer W is transferred from the pod PD1 to a substrate position P7 of the process chamber PM4 and mounted onto the substrate position P7 (arrow U7), as described above. Thereafter, the wafer processing is executed. In the detailed description, the vacuum lock chamber VL1 has been used, but the vacuum lock chamber VL2 may be used herein. That is, the vacuum lock chambers VL1 and VL2, which may be used at a point of time when the wafer W is transferred, may be selectively used.

When the predetermined wafer processing is completed, the wafer W is unloaded from the process chamber. In general, when the same sequence recipe is executed in the respective process chambers PM1 through PM4, wafer processing times are nearly equal. Therefore, since the wafer processing is first completed at the process chamber PM1 wherein the wafer W is first transferred, the processed wafer W mounted on the substrate position P4 is first picked up by the vacuum transfer robot VR, passed through the vacuum transfer chamber TM (arrow D1), transferred to a substrate position P10 of the vacuum lock chamber VL2 whose pressure is nearly adjusted to a vacuum state, and then mounted on the substrate position P10 (arrow D5). Thereafter, when the pressure of the vacuum lock chamber VL2 is nearly adjusted to an atmospheric pressure state, the wafer W is picked up from the substrate position P10 using the atmosphere transfer robot VR, passed through the atmosphere transfer chamber LM (arrow D6), and stored in a predetermined empty slot of the pod PD1 (arrow D7). In turn, the processed wafer W is picked up from the substrate position P5 of the process chamber PM2 using the vacuum transfer robot VR, as described above. Thereafter, the wafer W is unloaded into the vacuum transfer chamber TM (arrow D2). Thereafter, the wafer W is passed through the vacuum lock chamber VL2 and stored in the pod PD1 (arrow D5, arrow D6, arrow D7), as described above. Subsequently, the processed wafer W is picked up from the substrate position P6 of the process chamber PM3 using the vacuum transfer robot VR, as described above. Thereafter, the wafer W is unloaded into the vacuum transfer chamber TM (arrow D3), passed through the vacuum lock chamber VL1, and stored in an empty slot of the pod PD1. In turn, the wafer W is picked up from the substrate position P7 of the process chamber PM4 using the vacuum transfer robot VR, as described above. Thereafter, the wafer W is unloaded into the vacuum transfer chamber TM (arrow D4), passed through the vacuum lock chamber VL1, and stored in an empty slot of the pod PD1. Further, the processed wafer is not returned to the initially extracted pod PD1, but may be transferred to another pod PD2 or pod PD3 and stored therein.

(Application of Three of Four Process Chambers)

Figure 12:
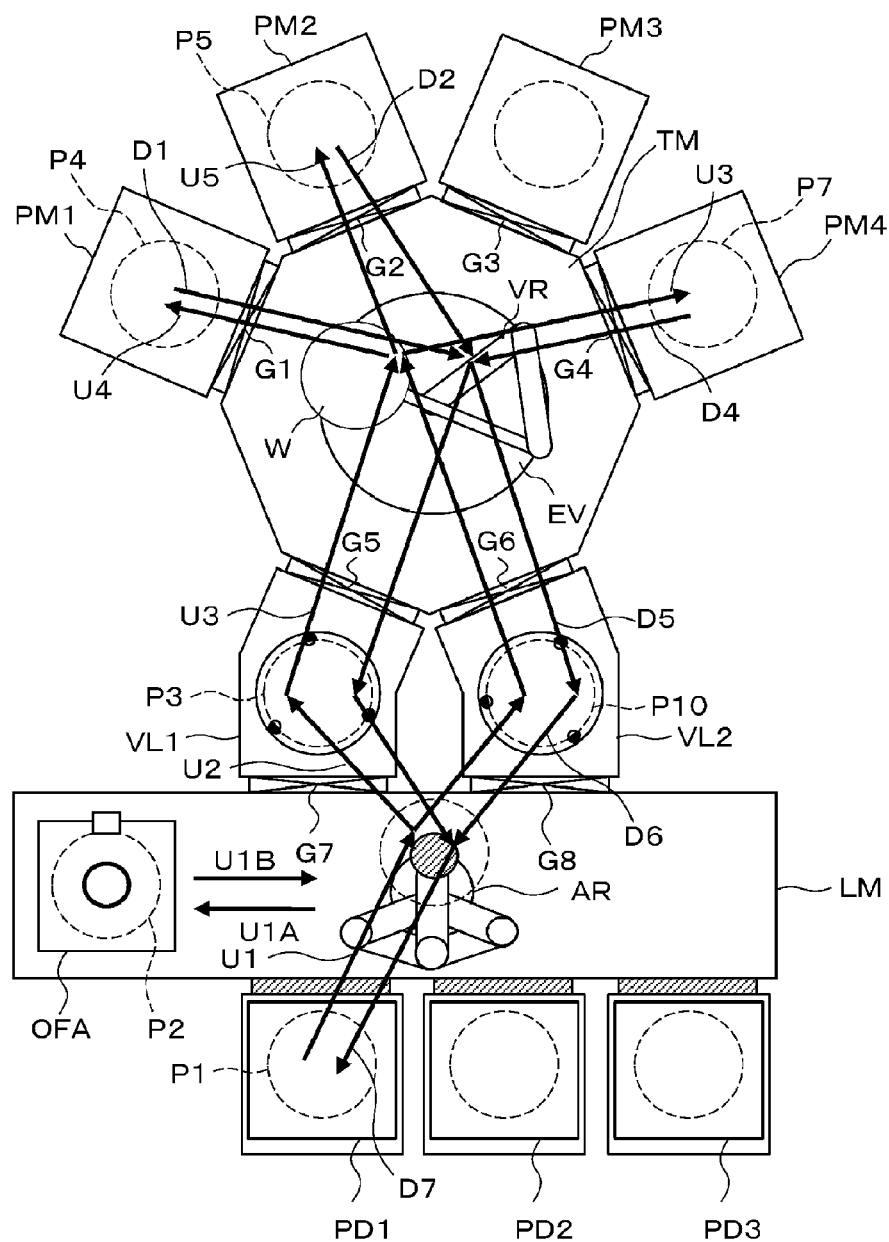
FIG. 12 is a configuration diagram schematically exemplifying an operation scheme of process chambers when a substrate processing apparatus is automatically operated in accordance with one embodiment of the present invention.

When a sequence recipe for applying three process chambers PM1, PM2 and PM4 among the process chambers PM1, PM2, PM3 and PM4 is instructed as shown in FIG. 12, for example, the wafer processing is executed in the process chambers in the order of process chamber PM1→process chamber PM2→process chamber PM4. Each execution of the wafer processing is based on the substrate processing process described with reference to FIG. 6. Further, the process chamber PM3 which does not receive the instruction of the sequence recipe for applying the process chambers is, for example, suspended, or operated to execute the maintenance task. Further, since the switching operations of the gate valves G1 through G8 are the same as in the above-described substrate processing process, a description is omitted.

The wafer W as the production substrate stored in the pod PD1, is unloaded into the atmosphere transfer chamber LM using the atmosphere transfer robot AR (arrow U1), transitioned to the substrate position P2 of the OFA, and mounted on the substrate position P2 (arrow U1A) to determine a position of the wafer W. Subsequently, the wafer W on the substrate position P2 is picked up by the atmosphere transfer robot AR, transitioned from the atmosphere transfer chamber LM (arrow U1B) to the substrate position P3 of the vacuum lock chamber VL1 whose pressure is nearly adjusted to an atmospheric pressure state, and mounted on the substrate position P3 (arrow U2). When the pressure of the vacuum lock chamber VL1 is nearly adjusted to a vacuum state, the wafer W is picked up from the substrate position P3 using the vacuum transfer robot VR, passed through the vacuum transfer chamber TM whose pressure is nearly adjusted to a vacuum state (arrow U3), transferred to the substrate position P4 of the process chamber PM1 whose pressure is nearly adjusted to a vacuum state, and mounted on the substrate position P4 (arrow U4). Thereafter, the wafer processing is executed at the process chamber PM1. While the wafer processing is executed at the process chamber PM1, another wafer is transferred from the pod PD1 to the substrate position P5 of the process chamber PM2, and mounted on the substrate position P5 (arrow U5), as described above. Thereafter, the wafer processing is executed. Subsequently, while the wafer processing is executed at the process chambers PM1 and PM2, another wafer W is transferred from the pod PD1 to the substrate position P7 of the process chamber PM4, and mounted on the substrate position P7 (arrow U7), as described above. Thereafter, the wafer processing is executed. In the detailed description, the vacuum lock chamber VL1 has been used, but the vacuum lock chamber VL2 may be used herein. That is, the vacuum lock chambers VL1 and VL2, which may be used at a point of time when the wafer W is transferred, may be selectively used.

When the predetermined wafer processing is completed, the wafer W is unloaded from the process chamber. In general, when the same sequence recipe is executed in the respective process chambers PM1, PM2 and PM4, wafer processing times are nearly equal. Therefore, since the wafer processing is first completed at the process chamber PM1 wherein the wafer W is first transferred, the processed wafer W mounted on the substrate position P4 is first picked up by the vacuum transfer robot VR, passed through the vacuum transfer chamber TM (arrow D1), transferred to a substrate position P10 of the vacuum lock chamber VL2 whose pressure is nearly adjusted to a vacuum state, and then mounted on the substrate position P10 (arrow D5). Thereafter, when the pressure of the vacuum lock chamber VL2 is nearly adjusted to an atmospheric pressure state, the wafer W is picked up from the substrate position P10 using the atmosphere transfer robot VR, passed through the atmosphere transfer chamber LM (arrow D6), and stored in a predetermined empty slot of the pod PD1 (arrow D7). In turn, the processed wafer W is picked up from the substrate position P5 of the process chamber PM2 whose processing is completed using the vacuum transfer robot VR, as described above. Thereafter, the wafer W is unloaded into the vacuum transfer chamber TM (arrow D2). Thereafter, the wafer W is passed through the vacuum lock chamber VL2 and stored in the pod PD1 (arrow D5, arrow D6, arrow D7), as described above. Subsequently, the processed wafer W is picked up from the substrate position P7 of the process chamber PM4 using the vacuum transfer robot VR, as described above. Thereafter, the wafer W is unloaded into the vacuum transfer chamber TM (arrow D4), passed through the vacuum lock chamber VL1, and stored in an empty slot of the pod PD1. Further, the processed wafer is not returned to the initially unloaded pod PD1, but may be transferred to a separate pod PD2 or pod PD3 and stored therein.

(Application of One of Four Process Chambers)

Figure 13:
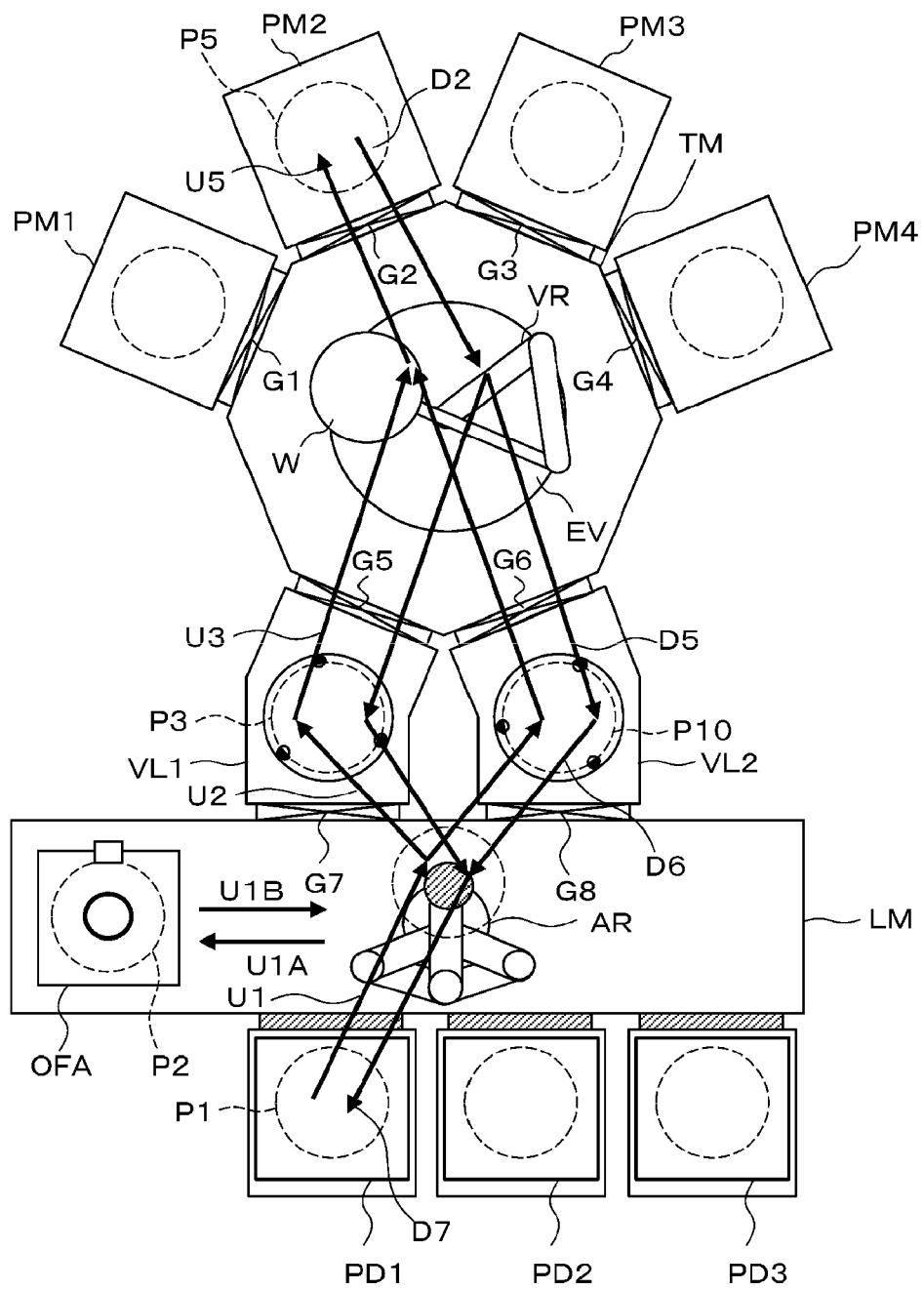
FIG. 13 is a configuration diagram schematically exemplifying an operation scheme of process chambers when the substrate processing apparatus is automatically operated in accordance with one embodiment of the present invention.

When a sequence recipe for applying only one process chamber PM2 among the process chambers PM1, PM2, PM3 and PM4 is instructed as shown in FIG. 13, for example, the wafer processing is executed only in the process chamber PM2. The wafer processing is based on the substrate processing process described with reference to FIG. 6. Further, the process chambers PM1, PM3 and PM4 which do not receive the instruction of the sequence recipe for applying the process chambers are, for example, suspended, or operated to execute the maintenance task. Further, since the switching operations of the gate valves G1 through G8 are the same as in the above-described substrate processing process, a description is omitted.

The wafer W as the production substrate stored in the pod PD1, is first extracted into the atmosphere transfer chamber LM using the atmosphere transfer robot AR (arrow U1), transitioned to the substrate position P2 of the OFA, and mounted on the substrate position P2 (arrow U1A) to determine a position of the wafer W. Subsequently, the wafer W on the substrate position P2 is picked up by the atmosphere transfer robot AR, transitioned from the atmosphere transfer chamber LM (arrow U1B) to the substrate position P3 of the vacuum lock chamber VL1 whose pressure is nearly adjusted to an atmospheric pressure state, and mounted on the substrate position P3 (arrow U2). Thereafter, when the pressure of the vacuum lock chamber VL1 is nearly adjusted to a vacuum state, the wafer W is picked up from the substrate position P3 using the vacuum transfer robot VR, passed through the vacuum transfer chamber TM whose pressure is nearly adjusted to a vacuum state (arrow U3), transferred to the substrate position P5 of the process chamber PM2 whose pressure is nearly adjusted to a vacuum state, and mounted on the substrate position P4 (arrow U5). Thereafter, the wafer processing is executed at the process chamber PM2. In the detailed description, the vacuum lock chamber VL1 has been used, but the vacuum lock chamber VL2 may be used herein. That is, the vacuum lock chambers VL1 and VL2, which may be used at a point of time when the wafer W is transferred, may be selectively used.

When the predetermined wafer processing is completed, the processed wafer W mounted on the substrate position P5 is first picked up by the vacuum transfer robot VR, passed through the vacuum transfer chamber TM (arrow D2), transferred to the substrate position P10 of the vacuum lock chamber VL2 whose pressure is nearly adjusted to a vacuum state, and mounted on the substrate position P10 (arrow D5). Thereafter, when the pressure of the vacuum lock chamber VL2 is nearly adjusted to an atmospheric pressure state, the wafer W is picked up from the substrate position P10 using the atmosphere transfer robot VR, passed through the atmosphere transfer chamber LM (arrow D6), and stored in a predetermined empty slot of the pod PD1 (arrow D7). Further, the processed wafer is not returned to the initially extracted pod PD1, but may be transferred to another pod PD2 or pod PD3 and stored therein.

Figure 14:
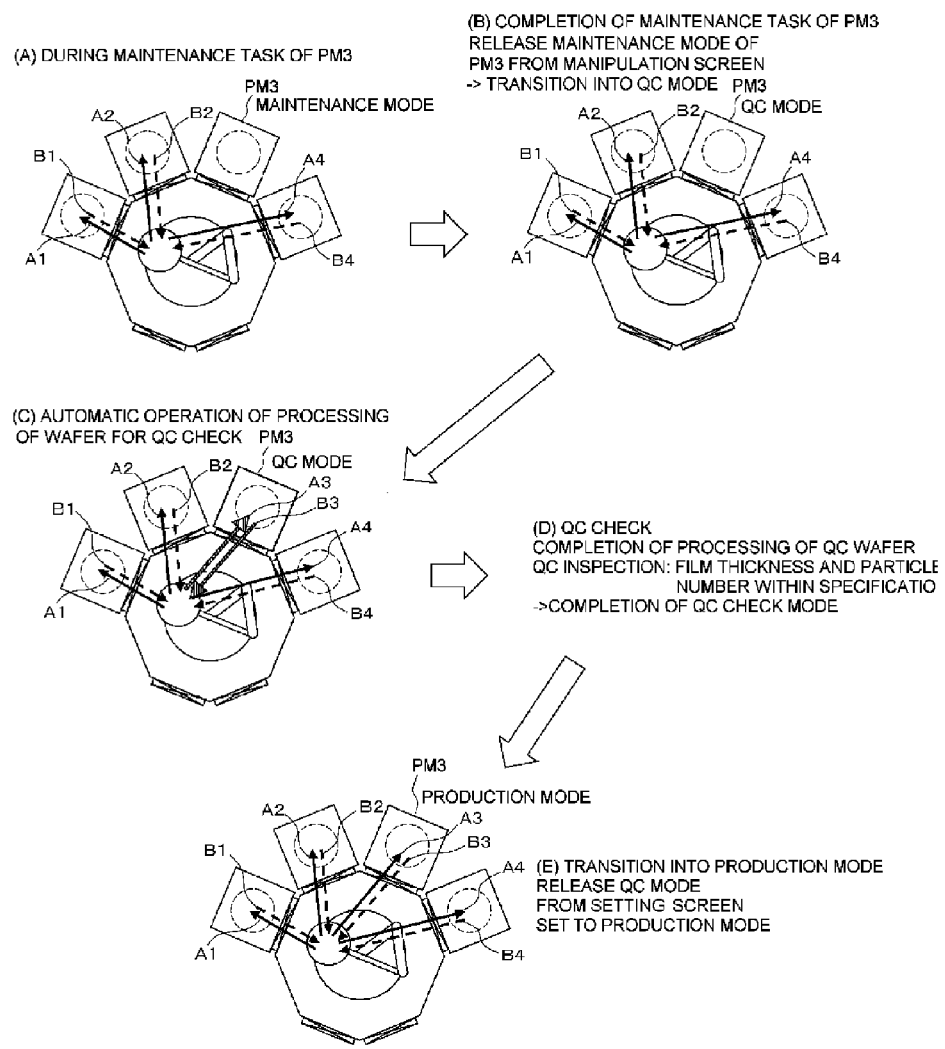
FIG. 14 is a flow diagram illustrating an operation of process chambers from a maintenance task in a predetermined process chamber to a process in which a production wafer can be processed while continuing a production.

(5) Simultaneous Operation of Process Chambers in Plurality of Different Operation Modes FIG. 14 is a diagram showing a flow that, when an error is generated in the process chamber PM3 during automatic operations of the process chambers PM1, PM2, PM3 and PM4, the maintenance task is performed in the process chamber PM3 while continuing to perform production at the process chambers PM1, PM2 and PM4 and the production wafer W can be processed again in the process chamber PM3.

When process recipes are set in advance to all of the process chambers PM1, PM2, PM3 and PM4 as shown in FIG. 5, automatic operations are executed in the process chambers PM1, PM2, PM3 and PM4. In this case, a case where the maintenance task is executed in the process chamber PM3 will be described with reference to FIG. 14, as follows.

(A) During Execution of Maintenance Task of PM3

In this case, since a maintenance transition instruction is received from the manipulation unit 100 or the overall controller 90, an operation mode of the process chamber PM3 is assigned to a "maintenance mode." Therefore, the production wafer W is loaded into the process chambers PM1, PM2 and PM4 using the vacuum transfer robot VR, as shown by arrows A1, A2 and A4, thereby performing a predetermined production process. Thereafter, the wafer W completed execution of the predetermined production process is unloaded into the vacuum transfer chamber TM using the vacuum transfer robot VR, as shown by arrows B1, B2 and B4. Further, the transfer of the production wafer and the wafer for QC check to the process chamber PM3 which the "maintenance mode" is assigned is inhibited. Therefore, there is no possibility of transferring the production wafer W and the wafer for QC check to the process chamber PM3 whose maintenance task is under way due to a mistake in application.

(B) Completion of Maintenance Task of PM3

When the maintenance task of the process chamber PM3 is completed and the maintenance mode is then released, the process chamber PM3 is transitioned to a "QC mode" and the QC check is executed. In this case, the transfer of the production wafer W is inhibited, and only the transfer of the quality control wafer W is permitted. Therefore, there is no possibility of transferring the production wafer W to the process chamber PM3 whose QC check is not completed due to a mistake in application.

(C) Automatic Operation of Wafer for QC Check

In turn, a sequence recipe for processing the quality control wafer W at the process chamber PM3 is input into the setting screen 120 displayed on the display unit 115. Therefore, an execution instruction for processing the wafer for QC check is transmitted from the overall controller 90 to the process module controller 93. Thereafter, the processing of the quality control wafer W (for example, film formation) instructed by the process module controller 93 is executed at the process chamber PM3. Therefore, the quality control wafer W is loaded into the process chamber PM3 using the vacuum transfer robot VR as shown by arrow A3, and a predetermined processing is performed. Thereafter, the processed wafer W is unloaded into the vacuum transfer chamber TM using the vacuum transfer robot VR, as shown by arrow B3. Further, the production wafer W is loaded into the process chambers PM1, PM2 and PM4 using the vacuum transfer robot VR as shown by arrows A1, A2 and A4, and a predetermined processing is performed. Thereafter, the processed wafer W is unloaded into the vacuum transfer chamber TM using the vacuum transfer robot VR, as shown by arrows B1, B2 and B4. As described above, the processing of the production wafer W and the processing of the wafer for QC check may be performed at the same time, and performed in an automatic operation mode. In this case, the transfer of the production wafer W to the process chamber PM3 to which the "QC mode" is assigned is inhibited, and only the transfer of the wafer for QC check is permitted. Therefore, there is no possibility of transferring the production wafer W to the process chamber PM3 whose QC check is not completed due to a mistake in application.

(D) QC Check

After the processing of the wafer for QC check is completed, a quality inspection of a film formed on the quality control wafer W is performed. As inspection items, a film thickness and a particle number may be measured. During the quality inspection, the operation mode of the process chamber PM3 is set to the "QC mode," but the automatic operation is continuously executed in the "production mode" at the process chambers PM1, PM2 and PM4. Therefore, the production wafer W is transferred and processed in the process chambers PM1, PM2 and PM4, as described above. Further, the transfer of the production wafer W to the process chamber PM3 to which the "QC mode" is assigned is inhibited, and only the transfer of the wafer for QC check is permitted. Therefore, there is no possibility of transferring the production wafer W to the process chamber PM3 whose QC check is not completed due to a mistake in application.

(E) Transition to Production Mode

When the measurement results of the quality inspection are confirmed to be within the predetermined specs and the QC mode is released, the operation mode of the process chamber PM3 is again transitioned to the "production mode," and all of the operation modes of the process chambers PM1 through PM4 become the "production mode." Therefore, the production wafer W is transferred to the process chambers PM1 through PM4. In this case, the transfer of the quality control wafer W to the process chambers PM1 through PM4 is inhibited, and only the transfer of the production wafer W is permitted. Therefore, there is no possibility of transferring wafers other than the production wafer W to the process chambers PM1 through PM4 due to a mistake in application. Further, when neither film thickness nor particle number is within the predetermined specs, although not shown herein, the maintenance task of the process chambers is, for example, executed again.

(6) Advantages According to The embodiment

According to the embodiment, one or more advantages will be obtained, as follows.

(A) The operation mode according to the embodiment includes a "maintenance mode" in which the maintenance checks of the process chambers PM1, PM2, PM3 and PM4 as process chambers are performed, a "QC mode" in which a wafer W for QC check as a quality control substrate in the process chambers PM1, PM2, PM3 and PM4 after the maintenance check is processed, and a "production mode" in which a production wafer as a production substrate is processed. Therefore, it is possible to select the "QC mode" to process the quality control wafer W when the QC check is executed. Further, it is possible to select the "production mode" to process the production wafer W when the production is performed.

(B) As the integrated controller according to the embodiment, the overall controller 90 controls the vacuum transfer robot VR as a transfer mechanism to transfer the quality control wafer W as the quality control substrate into the process chamber PM to which the "QC mode" is assigned and inhibits the transfer of the production wafer W into the process chamber, and to transfer the production wafer W and inhibits the transfer of the quality control wafer W into the process chamber PM which the "production mode" is instructed. Therefore, it is possible to transfer only the quality control wafer W to the process chamber which the "QC mode" is set, and to prevent the transfer of the production wafer W to the process chamber PM which the "QC mode" is assigned. As a result, since there is no possibility of transferring the production wafer W into the process chamber wherein QC check is under way to be processed during the automatic operation, it is possible to avoid a lockout (inability in use) of the process chamber PM.

(C) The manipulation unit 100 according to the embodiment includes the display device 110. Further, the setting screen 120 for selecting the substrate used in the "QC mode" and the "production mode" as operation instructions may be displayed on the display unit 115 of the display device 110. Therefore, a manipulator may assign the transfer of the quality control wafer W.

In addition, the setting screen 120 includes a configuration of selecting any of the process chambers PM1 through PM4 which production modes are assigned respectively are executed, and a configuration of setting a process recipe executed in the production mode. Therefore, the manipulator may perform the assignment of the process chamber PM and the assignment of the process recipe on the setting screen 120.

The manipulation unit 100 may transmit a predetermined operation instruction including the selected operation mode to the overall controller 90. Further, the overall controller 90 may instruct the received operation instruction to the process module controllers 91 through 94, and the process module controllers 91 through 94 may execute the wafer processing in the corresponding process chambers PM1 through PM4, based on the operation instruction.

(D) In the selection of the operation mode according to the embodiment, since one or more operation modes are selected at a time in a plurality of process chambers PM while one operation mode is selected in one process chamber PM, it is possible to perform a command of different operation modes at the process chambers at the same time. That is, even when the "maintenance mode" or "QC mode" is selected in some of the process chambers PM, it is possible to continue to perform production at the other process chambers PM. Therefore, a working ratio of the substrate processing apparatus may be improved.

Other Embodiments of the Present Invention

The substrate processing apparatus is not limited to the semiconductor manufacturing apparatus for processing a semiconductor substrate as described in the above-described embodiments, but an apparatus for processing a glass substrate, such as an LCD device, may be used. In addition of the specific contents of substrate processing, heat treatment, oxidation treatment, nitration treatment, diffusion treatment, exposure treatment impurity doping, etc. may be used as well as the film formation. Further, the process chamber may be a plasma process chamber in which the wafer W as the substrate transferred into the process chamber PM is subjected to a predetermined plasma treatment (for example, plasma CVD treatment, plasma etching treatment, plasma ashing treatment, plasma doping treatment, etc.) using plasma introduced thereinto or plasma generated therein. Further, the film formation treatment may include, for example, treatment such as CVD, PVD and ALD, treatment for forming an oxide film, a nitride film, a carbide film, an oxynitride film, etc., treatment for forming an organic film, or treatment for forming a film including a metal.

Preferred Embodiments of the Present Invention

Hereinafter, the preferred embodiments of the present invention will be described in detail.

A first embodiment of the present invention provides a substrate processing apparatus including:
a plurality of process chambers for processing a substrate,
a transfer chamber connected to the process chambers,
a transfer mechanism located inside the transfer chamber to transfer the substrate between the transfer chamber and the process chambers,
a process controller connected to each of the process chambers to control a processing of the substrate in each of the process chambers,
an integrated controller connected to the process controller to control an operation of the transfer mechanism, and
a manipulation unit connected to the integrated controller and the process controller to transmit a processing instruction to the integrated controller and the process controller and to simultaneously receive an operation report via the integrated controller from the transfer mechanism, and to receive an operation report via the process controller from a processing mechanism located in the process chamber,
wherein the integrated controller controls the transfer mechanism to transfer a quality control substrate into a process chamber which is assigned and inhibits a transfer of a production substrate into the process chamber and simultaneously transfer the production substrate into each of the process chambers of the plurality except the process chamber.

A second embodiment of the present invention provides the substrate processing apparatus described in the first embodiment,
wherein the manipulation unit includes a display device, and
a setting screen for selecting the maintenance mode, the QC mode, and the production mode in each of the process chambers is displayed on the display device.

A third embodiment of the present invention provides the substrate processing apparatus described in the second embodiment,
wherein the setting screen includes a configuration for assigning the process chamber in which the operation mode is executed, and a configuration of setting a process recipe executed at the operation mode.

A fourth embodiment of the present invention provides the substrate processing apparatus described in any one of the first through third embodiments,
wherein one or more of the operation modes are simultaneously selected in the plurality of process chambers and one of the operation modes is selected in one of the process chambers.

A fifth embodiment of the present invention provides the substrate processing apparatus described in the fourth embodiment,
wherein the overall controller assigns one of the operation modes to at least one of the plurality of process chambers via the process controller, and also assigns the operation modes other than the assigned operation mode to the other process chambers, and
the processing at a corresponding operation mode in the process chamber to which one of the operation modes is assigned and the processing at a corresponding operation mode in the process chambers to which operation modes are assigned except the assigned operation mode are executed.

A sixth embodiment of the present invention provides a substrate processing apparatus including:
a plurality of process chambers for processing a substrate,
a vacuum transfer chamber connected to the process chambers,
a spare chamber connected to the vacuum transfer chamber to reduce a pressure, an atmosphere transfer chamber connected to the spare chamber to transfer the substrate under an atmospheric pressure condition, a substrate receiving unit connected to the atmosphere transfer chamber and including a substrate receiving container for receiving the substrate, a vacuum transfer mechanism located inside the vacuum transfer chamber to transfer the substrate between the vacuum transfer chamber and the spare chamber, an atmosphere transfer mechanism located inside the atmosphere transfer chamber to transfer the substrate between the spare chamber and the substrate receiving unit, a process controller connected to the process chambers to control operations of the process chambers, an integrated controller connected to the process controller for controlling the operations of the process chambers via the process controller, and simultaneously connected to the vacuum transfer mechanism and the atmosphere transfer mechanism to control each transfer operation, and a manipulation unit connected to the integrated controller to transmit an operation instruction to the process controller via the integrated controller and simultaneously receive an operation report from the process controller via the integrated controller, wherein an operation mode of the process chambers includes a maintenance mode for performing a maintenance check of the process chambers, a QC mode for processing a quality control substrate in the process chambers after the maintenance check, and a production mode for processing a production substrate, the operation mode selected as the operation instruction is input into the manipulation unit, the selected operation mode is instructed to the process controller via the integrated controller, and the integrated controller controls the vacuum transfer mechanism and the atmosphere transfer mechanism to transfer the quality control substrate and inhibits a transfer of the substrate into the process chambers to which the maintenance mode is assigned, and inhibits a transfer of the production substrate into the process chambers to which the QC mode is assigned, and transfer the production substrate and inhibits a transfer of the quality control substrate into the process chambers to which the production mode is instructed.

A seventh embodiment of the present invention provides a method of manufacturing a semiconductor device that includes transferring a substrate into process chambers and processing the substrate using a transfer mechanism, the method comprising:

a step of setting an operation mode of the process chambers to a maintenance mode for performing a maintenance check and enabling the maintenance task of the process chambers and inhibiting a transfer of the substrate into the process chambers setting an operation mode to QC mode;

a step of setting an operation mode of the process chambers to a QC mode for processing the quality control substrate, transferring the quality control substrate and inhibiting a transfer of the production substrate using the transfer mechanism, and processing the quality control substrate in the process chambers; and a step of inspecting a quality of the processed quality control substrate, setting an operation mode of the process chambers to a production mode for processing the production substrate when the quality satisfies a predetermined level, transferring the production substrate in the process chambers using the transfer mechanism, and processing the production substrate in the process chambers.

An eighth embodiment of the present invention provides the method of manufacturing a semiconductor device described in the seventh embodiment, wherein the inspecting of the quality of the processed quality control substrate includes measuring a thickness of film formed on the substrate, and measuring the number of particles adhered to the substrate.

What is claimed is:

1. A substrate processing apparatus comprising:
a plurality of process chambers configured to process substrates;
a transfer chamber connected to the process chambers;
a transfer mechanism located inside the transfer chamber to transfer the substrates between the transfer chamber and the process chambers;
a process controller connected to each of the plurality of process chambers to control a processing of the substrates in each of the process chambers;
an integrated controller connected to the process controller to control an operation of the transfer mechanism, and
a manipulation unit connected to the integrated controller and the process controller, the manipulation unit being configured to transmit a command thereto and to receive an operation report from the transfer mechanism via the integrated controller,
wherein the manipulation unit comprises a display unit displaying a setting screen for selecting one of a maintenance mode wherein a maintenance check of the plurality of process chambers is performed, a QC mode wherein a quality control substrate is processed in the plurality of process chambers after performing the maintenance check and a production mode wherein a production substrate is processed in the plurality of process chambers,
wherein, when a predetermined process chamber of the plurality of process chambers is set to the maintenance mode on the setting screen, the integrated controller controls the transfer mechanism to inhibit a transfer of the substrates into the predetermined process chamber,
wherein, when the predetermined process chamber of the plurality of process chambers is set to the QC mode on the setting screen, the integrated controller controls the transfer mechanism to transfer the quality control substrate into the predetermined process chamber while inhibiting a transfer of the product substrate into the predetermined process, and
wherein, when the predetermined process chamber of the plurality of process chambers is set to the production mode on the setting screen, the integrated controller controls the transfer mechanism to transfer the product substrate into the predetermined process chamber while inhibiting a transfer of the quality control substrate into process chambers of the plurality of process chambers other than the predetermined process chamber.

2. The substrate processing apparatus of claim 1, wherein the integrated controller transmits: a command for closing a gate valve between the predetermined process chamber and the transfer chamber to the process controller when the predetermined process chamber is set to the maintenance mode on the setting screen; and an instruction for starting a recipe for the maintenance check to the process controller after the gate valve is closed and the transfer of the substrates into the predetermined process chamber is inhibited, and the process controller performs a predetermined maintenance process by executing the recipe for the maintenance check in the predetermined process chamber.

3. The substrate processing apparatus of claim 1, wherein, when the predetermined process chamber of the plurality of process chambers is set to the QC mode on the setting screen, the integrated controller: changes a mode of the predetermined process chamber from the maintenance mode to the QC mode; controls the transfer mechanism to transfer the quality control substrate into the predetermined process chamber while inhibiting the transfer of the production substrate into the predetermined process chamber; and instructs the process controller to start a recipe for processing the quality control substrate after the quality control substrate is transferred into the predetermined process chamber, and the process controller executes the recipe for processing the quality control substrate.

4. The substrate processing apparatus of claim 3, wherein a measurement of a thickness of a film formed on the quality control substrate and a check of number of particles adhered to the quality control substrate are performed as a quality inspection of the quality control substrate when an execution of the recipe for processing the quality control substrate is complete, and the integrated controller accepts a re-set of an operation mode of the predetermined process chamber through the setting screen according to a result of the quality inspection.

5. The substrate processing apparatus of claim 4, wherein the integrated controller accepts through the setting screen the re-set of the operation mode of the predetermined process chamber from the QC mode to the maintenance mode when the result of the quality inspection is within a predetermined specification, and the integrated controller accepts through the setting screen the re-set of the operation mode of the predetermined process chamber from the QC mode to the production mode when the result of the quality inspection is out of the predetermined specification.

6. A method of transferring a substrate performed in a substrate processing apparatus of claim 1, the method comprising:

designating a predetermined process chamber of a plurality of process chambers to a maintenance mode when an error occurs in the predetermined process chamber during a transfer of a product substrate and transferring the product substrate into the plurality of process chambers other than the predetermined process chamber while inhibiting the transfer of the product substrate into the predetermined process chamber;

designating the predetermined process chamber to a QC mode wherein a quality control substrate is processed after a maintenance check is complete and transferring a quality control substrate into the predetermined process chamber while continuously inhibiting the transfer of the product substrate into the predetermined process chamber;

inspecting a quality of the quality control substrate; and designating the predetermined process chamber to a production mode and transferring the production substrate into the predetermined process chamber when the quality of the quality control substrate satisfies a predetermined level, and re-designating the predetermined process to the maintenance mode from the QC mode when the quality of the quality control substrate dissatisfies the predetermined level.

7. A method of manufacturing a semiconductor device performed in a substrate processing apparatus of claim 1, the method comprising:

designating a predetermined process chamber of a plurality of process chambers to a maintenance mode by an integrated controller when an error occurs in the predetermined process chamber during a processing of a product substrate and processing the product substrate in the plurality of process chambers other than the predetermined process chamber by a process controller while inhibiting the transfer of the product substrate into the predetermined process chamber;

designating the predetermined process chamber to a QC mode from the maintenance mode wherein a quality control substrate is processed by the integrated controller after a maintenance check is complete and transferring a quality control substrate into the predetermined process chamber while continuously inhibiting the transfer of the product substrate into the predetermined process chamber;

processing the quality control substrate in the predetermined process chamber by the process controller while processing the product substrate in the plurality of process chambers other than the predetermined process chamber by the process controller;

inspecting a quality of the quality control substrate; and designating the predetermined process chamber to a production mode by the integrated controller and transferring the product substrate to the predetermined process chamber, and processing the production substrate in the plurality of process chambers when the quality of the quality control substrate satisfies a predetermined level, and re-performing the maintenance check when the quality of the quality control substrate dissatisfies the predetermined level.

* * * * *